(12) United States Patent
Banna et al.

(10) Patent No.: US 9,559,216 B2
(45) Date of Patent: Jan. 31, 2017

(54) SEMICONDUCTOR MEMORY DEVICE AND METHOD FOR BIASING SAME

(75) Inventors: Srinivasa Rao Banna, San Jose, CA (US); Michael A. Van Buskirk, Saratoga, CA (US); Timothy Thurgate, Sunnyvale, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 355 days.

(21) Appl. No.: 13/153,707

(22) Filed: Jun. 6, 2011

(65) Prior Publication Data

US 2012/0307568 A1    Dec. 6, 2012

(51) Int. Cl.
G11C 16/04    (2006.01)
H01L 29/792    (2006.01)
H01L 27/115    (2006.01)

(52) U.S. Cl.
CPC ......... *H01L 29/792* (2013.01); *G11C 16/0416* (2013.01); *H01L 27/11556* (2013.01); *H01L 27/11565* (2013.01); *H01L 27/11568* (2013.01); *H01L 27/11582* (2013.01)

(58) Field of Classification Search
CPC .............. H01L 29/792; H01L 27/11582; H01L 27/11556; H01L 27/11565; H01L 27/11568; G11C 16/0416
USPC ........................ 365/188.01–185.33
See application file for complete search history.

(56) References Cited

U.S. PATENT DOCUMENTS

| | | | |
|---|---|---|---|
| 3,439,214 A | 4/1969 | Kabell | |
| 3,997,799 A | 12/1976 | Baker | |
| 4,032,947 A | 6/1977 | Kesel et al. | |
| 4,250,569 A | 2/1981 | Sasaki et al. | |
| 4,253,106 A * | 2/1981 | Goldsmith et al. | 257/316 |
| 4,262,340 A | 4/1981 | Sasaki et al. | |
| 4,298,962 A | 11/1981 | Hamano et al. | |
| 4,371,955 A | 2/1983 | Sasaki | |
| 4,527,181 A | 7/1985 | Sasaki | |
| 4,630,089 A | 12/1986 | Sasaki et al. | |
| 4,658,377 A | 4/1987 | McElroy | |
| 4,791,610 A | 12/1988 | Takemae | |

(Continued)

FOREIGN PATENT DOCUMENTS

| | | |
|---|---|---|
| CA | 272437 | 7/1927 |
| EP | 0 030 856 | 6/1981 |

(Continued)

OTHER PUBLICATIONS

International Search Report and Written Opinion corresponding to International Application No. PCT/US2012/040891, Dec. 26, 2012, 8 pages.

(Continued)

*Primary Examiner* — Khamdan Alrobaie

(74) *Attorney, Agent, or Firm* — Wilmer Cutler Pickering Hale and Dorr LLP

(57) ABSTRACT

Techniques for providing a semiconductor memory device are disclosed. In one particular embodiment, the techniques may be realized as a semiconductor memory device including a plurality of memory cells arranged in an array of rows and columns. Each memory cell may include a first region coupled to a source line, a second region coupled to a bit line, and a body region capacitively coupled to at least one word line via a tunneling insulating layer and disposed between the first region and the second region.

28 Claims, 9 Drawing Sheets

(56) References Cited

U.S. PATENT DOCUMENTS

| | | | |
|---|---|---|---|
| 4,807,195 A | 2/1989 | Busch et al. |
| 4,954,989 A | 9/1990 | Auberton-Herve et al. |
| 4,979,014 A | 12/1990 | Hieda et al. |
| 5,010,524 A | 4/1991 | Fifield et al. |
| 5,144,390 A | 9/1992 | Matloubian |
| 5,164,805 A | 11/1992 | Lee |
| 5,258,635 A | 11/1993 | Nitayama et al. |
| 5,313,432 A | 5/1994 | Lin et al. |
| 5,315,541 A | 5/1994 | Harari et al. |
| 5,350,938 A | 9/1994 | Matsukawa |
| 5,355,330 A | 10/1994 | Hisamoto et al. |
| 5,388,068 A | 2/1995 | Ghoshal et al. |
| 5,397,726 A | 3/1995 | Bergemont et al. |
| 5,432,730 A | 7/1995 | Shubat et al. |
| 5,446,299 A | 8/1995 | Acovic et al. |
| 5,448,513 A | 9/1995 | Hu et al. |
| 5,466,625 A | 11/1995 | Hsieh et al. |
| 5,489,792 A | 2/1996 | Hu et al. |
| 5,506,436 A | 4/1996 | Hayashi et al. |
| 5,515,383 A | 5/1996 | Katoozi |
| 5,526,307 A | 6/1996 | Yiu et al. |
| 5,528,062 A | 6/1996 | Hsieh et al. |
| 5,568,356 A | 10/1996 | Schwartz |
| 5,583,808 A | 12/1996 | Brahmbhatt |
| 5,593,912 A | 1/1997 | Rajeevakumar |
| 5,606,188 A | 2/1997 | Bronner et al. |
| 5,608,250 A | 3/1997 | Kalnitsky |
| 5,627,092 A | 5/1997 | Alsmeier et al. |
| 5,631,186 A | 5/1997 | Park et al. |
| 5,677,867 A | 10/1997 | Hazani |
| 5,696,718 A | 12/1997 | Hartmann |
| 5,740,099 A | 4/1998 | Tanigawa |
| 5,754,469 A | 5/1998 | Hung et al. |
| 5,774,411 A | 6/1998 | Hsieh et al. |
| 5,778,243 A | 7/1998 | Aipperspach et al. |
| 5,780,906 A | 7/1998 | Wu et al. |
| 5,784,311 A | 7/1998 | Assaderaghi et al. |
| 5,798,968 A | 8/1998 | Lee et al. |
| 5,811,283 A | 9/1998 | Sun |
| 5,847,411 A | 12/1998 | Morii |
| 5,877,978 A | 3/1999 | Morishita et al. |
| 5,886,376 A | 3/1999 | Acovic et al. |
| 5,886,385 A | 3/1999 | Arisumi et al. |
| 5,897,351 A | 4/1999 | Forbes |
| 5,929,479 A | 7/1999 | Oyama |
| 5,929,480 A * | 7/1999 | Hisamune ............... 257/320 |
| 5,930,648 A | 7/1999 | Yang |
| 5,936,265 A | 8/1999 | Koga |
| 5,939,745 A | 8/1999 | Park et al. |
| 5,943,258 A | 8/1999 | Houston et al. |
| 5,943,581 A | 8/1999 | Lu et al. |
| 5,960,265 A | 9/1999 | Acovic et al. |
| 5,963,473 A | 10/1999 | Norman |
| 5,968,840 A | 10/1999 | Park et al. |
| 5,977,578 A | 11/1999 | Tang |
| 5,982,003 A | 11/1999 | Hu et al. |
| 5,986,914 A | 11/1999 | McClure |
| 6,018,172 A | 1/2000 | Hidada et al. |
| 6,048,756 A | 4/2000 | Lee et al. |
| 6,081,443 A | 6/2000 | Morishita et al. |
| 6,081,456 A * | 6/2000 | Dadashev ............ 365/185.23 |
| 6,096,598 A | 8/2000 | Furukawa et al. |
| 6,097,056 A | 8/2000 | Hsu et al. |
| 6,097,624 A | 8/2000 | Chung et al. |
| 6,111,778 A | 8/2000 | MacDonald et al. |
| 6,121,077 A | 9/2000 | Hu et al. |
| 6,133,597 A | 10/2000 | Li et al. |
| 6,157,216 A | 12/2000 | Lattimore et al. |
| 6,171,923 B1 | 1/2001 | Chi et al. |
| 6,177,300 B1 | 1/2001 | Houston et al. |
| 6,177,698 B1 | 1/2001 | Gruening et al. |
| 6,177,708 B1 | 1/2001 | Kuang et al. |
| 6,214,694 B1 | 4/2001 | Leobandung et al. |
| 6,222,217 B1 | 4/2001 | Kunikiyo |
| 6,225,158 B1 | 5/2001 | Furukawa et al. |
| 6,229,161 B1 | 5/2001 | Nemati et al. |
| 6,245,613 B1 | 6/2001 | Hsu et al. |
| 6,252,281 B1 | 6/2001 | Yamamoto et al. |
| 6,262,935 B1 | 7/2001 | Parris et al. |
| 6,292,424 B1 | 9/2001 | Ohsawa |
| 6,297,090 B1 | 10/2001 | Kim |
| 6,300,649 B1 | 10/2001 | Hu et al. |
| 6,320,227 B1 | 11/2001 | Lee et al. |
| 6,333,532 B1 | 12/2001 | Davari et al. |
| 6,333,866 B1 | 12/2001 | Ogata |
| 6,350,653 B1 | 2/2002 | Adkisson et al. |
| 6,351,426 B1 | 2/2002 | Ohsawa |
| 6,359,802 B1 | 3/2002 | Lu et al. |
| 6,384,445 B1 | 5/2002 | Hidaka et al. |
| 6,391,658 B1 | 5/2002 | Gates et al. |
| 6,403,435 B1 | 6/2002 | Kang et al. |
| 6,421,269 B1 | 7/2002 | Somasekhar et al. |
| 6,424,011 B1 | 7/2002 | Assaderaghi et al. |
| 6,424,016 B1 | 7/2002 | Houston |
| 6,429,477 B1 | 8/2002 | Mandelman et al. |
| 6,432,769 B1 | 8/2002 | Fukuda et al. |
| 6,440,872 B1 | 8/2002 | Mandelman et al. |
| 6,441,435 B1 | 8/2002 | Chan |
| 6,441,436 B1 | 8/2002 | Wu et al. |
| 6,466,511 B2 | 10/2002 | Fujita et al. |
| 6,479,862 B1 | 11/2002 | King et al. |
| 6,480,407 B1 | 11/2002 | Keeth |
| 6,492,211 B1 | 12/2002 | Divakaruni et al. |
| 6,518,105 B1 | 2/2003 | Yang et al. |
| 6,531,754 B1 | 3/2003 | Nagano et al. |
| 6,537,871 B2 | 3/2003 | Forbes |
| 6,538,916 B2 | 3/2003 | Ohsawa |
| 6,544,837 B1 | 4/2003 | Divakaruni et al. |
| 6,548,848 B2 | 4/2003 | Horiguchi et al. |
| 6,549,450 B1 | 4/2003 | Hsu et al. |
| 6,552,398 B2 | 4/2003 | Hsu et al. |
| 6,552,932 B1 | 4/2003 | Cernea |
| 6,556,477 B2 | 4/2003 | Hsu et al. |
| 6,560,142 B1 | 5/2003 | Ando |
| 6,563,733 B2 | 5/2003 | Liu et al. |
| 6,566,177 B1 | 5/2003 | Radens et al. |
| 6,567,330 B2 | 5/2003 | Fujita et al. |
| 6,573,566 B2 | 6/2003 | Ker et al. |
| 6,574,135 B1 | 6/2003 | Komatsuzaki |
| 6,590,258 B2 | 7/2003 | Divakauni et al. |
| 6,590,259 B2 | 7/2003 | Adkisson et al. |
| 6,617,651 B2 | 9/2003 | Ohsawa |
| 6,621,725 B2 | 9/2003 | Ohsawa |
| 6,632,723 B2 | 10/2003 | Watanabe et al. |
| 6,650,565 B1 | 11/2003 | Ohsawa |
| 6,653,175 B1 | 11/2003 | Nemati et al. |
| 6,686,624 B2 | 2/2004 | Hsu |
| 6,703,673 B2 | 3/2004 | Houston |
| 6,707,118 B2 | 3/2004 | Muljono et al. |
| 6,714,436 B1 | 3/2004 | Burnett et al. |
| 6,721,222 B2 | 4/2004 | Somasekhar et al. |
| 6,825,524 B1 | 11/2004 | Ikehashi et al. |
| 6,861,689 B2 | 3/2005 | Burnett |
| 6,870,225 B2 | 3/2005 | Bryant et al. |
| 6,882,566 B2 | 4/2005 | Nejad et al. |
| 6,888,770 B2 | 5/2005 | Ikehashi |
| 6,891,225 B2 | 5/2005 | Horiguchi et al. |
| 6,894,913 B2 | 5/2005 | Yamauchi |
| 6,897,098 B2 | 5/2005 | Hareland et al. |
| 6,903,984 B1 | 6/2005 | Tang et al. |
| 6,909,151 B2 | 6/2005 | Hareland et al. |
| 6,912,150 B2 | 6/2005 | Portmann et al. |
| 6,913,964 B2 | 7/2005 | Hsu |
| 6,936,508 B2 | 8/2005 | Visokay et al. |
| 6,969,662 B2 | 11/2005 | Fazan et al. |
| 6,975,536 B2 | 12/2005 | Maayan et al. |
| 6,982,902 B2 | 1/2006 | Gogl et al. |
| 6,987,041 B2 | 1/2006 | Ohkawa |
| 7,030,436 B2 | 4/2006 | Forbes |
| 7,037,790 B2 | 5/2006 | Chang et al. |
| 7,041,538 B2 | 5/2006 | Ieong et al. |
| 7,042,765 B2 | 5/2006 | Sibigtroth et al. |
| 7,061,806 B2 | 6/2006 | Tang et al. |
| 7,085,153 B2 | 8/2006 | Ferrant et al. |

(56) References Cited

U.S. PATENT DOCUMENTS

| | | |
|---|---|---|
| 7,085,156 B2 | 8/2006 | Ferrant et al. |
| 7,170,807 B2 | 1/2007 | Fazan et al. |
| 7,177,175 B2 | 2/2007 | Fazan et al. |
| 7,187,581 B2 | 3/2007 | Ferrant et al. |
| 7,230,846 B2 | 6/2007 | Keshavarzi |
| 7,233,024 B2 | 6/2007 | Scheuerlein et al. |
| 7,256,459 B2 | 8/2007 | Shino |
| 7,301,803 B2 | 11/2007 | Okhonin et al. |
| 7,301,838 B2 | 11/2007 | Waller |
| 7,317,641 B2 | 1/2008 | Scheuerlein |
| 7,324,387 B1 | 1/2008 | Bergemont et al. |
| 7,335,934 B2 | 2/2008 | Fazan |
| 7,341,904 B2 | 3/2008 | Willer |
| 7,416,943 B2 | 8/2008 | Figura et al. |
| 7,456,439 B1 | 11/2008 | Horch |
| 7,460,395 B1 | 12/2008 | Cho et al. |
| 7,477,540 B2 | 1/2009 | Okhonin et al. |
| 7,492,632 B2 | 2/2009 | Carman |
| 7,517,744 B2 | 4/2009 | Mathew et al. |
| 7,539,041 B2 | 5/2009 | Kim et al. |
| 7,542,340 B2 | 6/2009 | Fisch et al. |
| 7,542,345 B2 | 6/2009 | Okhonin et al. |
| 7,545,694 B2 | 6/2009 | Srinivasa Raghavan et al. |
| 7,606,066 B2 | 10/2009 | Okhonin et al. |
| 7,688,629 B2 | 3/2010 | Kim |
| 7,696,032 B2 | 4/2010 | Kim et al. |
| 8,315,099 B2 | 11/2012 | Van Buskirk et al. |
| 2001/0050406 A1 | 12/2001 | Akita et al. |
| 2001/0055859 A1 | 12/2001 | Yamada et al. |
| 2002/0030214 A1 | 3/2002 | Horiguchi |
| 2002/0034855 A1 | 3/2002 | Horiguchi et al. |
| 2002/0036322 A1 | 3/2002 | Divakauni et al. |
| 2002/0051378 A1 | 5/2002 | Ohsawa |
| 2002/0064913 A1 | 5/2002 | Adkisson et al. |
| 2002/0070411 A1 | 6/2002 | Vermandel et al. |
| 2002/0072155 A1 | 6/2002 | Liu et al. |
| 2002/0076880 A1 | 6/2002 | Yamada et al. |
| 2002/0086463 A1 | 7/2002 | Houston et al. |
| 2002/0089038 A1 | 7/2002 | Ning |
| 2002/0098643 A1 | 7/2002 | Kawanaka et al. |
| 2002/0110018 A1 | 8/2002 | Ohsawa |
| 2002/0114191 A1* | 8/2002 | Iwata et al. ............ 365/185.23 |
| 2002/0130341 A1 | 9/2002 | Horiguchi et al. |
| 2002/0160581 A1 | 10/2002 | Watanabe et al. |
| 2002/0180069 A1 | 12/2002 | Houston |
| 2003/0003608 A1 | 1/2003 | Arikado et al. |
| 2003/0015757 A1 | 1/2003 | Ohsawa |
| 2003/0035324 A1 | 2/2003 | Fujita et al. |
| 2003/0042516 A1 | 3/2003 | Forbes et al. |
| 2003/0047784 A1 | 3/2003 | Matsumoto et al. |
| 2003/0057487 A1 | 3/2003 | Yamada et al. |
| 2003/0057490 A1 | 3/2003 | Nagano et al. |
| 2003/0102497 A1 | 6/2003 | Fried et al. |
| 2003/0112659 A1 | 6/2003 | Ohsawa |
| 2003/0123279 A1 | 7/2003 | Aipperspach et al. |
| 2003/0146474 A1 | 8/2003 | Ker et al. |
| 2003/0146488 A1 | 8/2003 | Nagano et al. |
| 2003/0151112 A1 | 8/2003 | Yamada et al. |
| 2003/0231521 A1 | 12/2003 | Ohsawa |
| 2003/0235075 A1 | 12/2003 | Forbes |
| 2004/0021137 A1 | 2/2004 | Fazan et al. |
| 2004/0021179 A1 | 2/2004 | Lee |
| 2004/0029335 A1 | 2/2004 | Lee et al. |
| 2004/0075143 A1 | 4/2004 | Bae et al. |
| 2004/0108532 A1 | 6/2004 | Forbes et al. |
| 2004/0188714 A1 | 9/2004 | Scheuerlein et al. |
| 2004/0217420 A1 | 11/2004 | Yeo et al. |
| 2004/0238845 A1* | 12/2004 | Hu et al. ............ 257/199 |
| 2005/0001257 A1 | 1/2005 | Schloesser et al. |
| 2005/0001269 A1 | 1/2005 | Hayashi et al. |
| 2005/0017240 A1 | 1/2005 | Fazan |
| 2005/0047240 A1 | 3/2005 | Ikehashi et al. |
| 2005/0062088 A1 | 3/2005 | Houston |
| 2005/0063224 A1 | 3/2005 | Fazan et al. |
| 2005/0064659 A1 | 3/2005 | Willer |
| 2005/0105342 A1 | 5/2005 | Tang et al. |
| 2005/0111255 A1 | 5/2005 | Tang et al. |
| 2005/0121710 A1 | 6/2005 | Shino |
| 2005/0135169 A1 | 6/2005 | Somasekhar et al. |
| 2005/0141262 A1 | 6/2005 | Yamada et al. |
| 2005/0141290 A1 | 6/2005 | Tang et al. |
| 2005/0145886 A1 | 7/2005 | Keshavarzi et al. |
| 2005/0145935 A1 | 7/2005 | Keshavarzi et al. |
| 2005/0167751 A1 | 8/2005 | Nakajima et al. |
| 2005/0189576 A1 | 9/2005 | Ohsawa |
| 2005/0208716 A1 | 9/2005 | Takaura et al. |
| 2005/0226070 A1 | 10/2005 | Ohsawa |
| 2005/0232043 A1 | 10/2005 | Ohsawa |
| 2005/0242396 A1 | 11/2005 | Park et al. |
| 2005/0265107 A1 | 12/2005 | Tanaka |
| 2006/0043484 A1 | 3/2006 | Cabral et al. |
| 2006/0084247 A1 | 4/2006 | Liu |
| 2006/0091462 A1 | 5/2006 | Okhonin et al. |
| 2006/0098481 A1 | 5/2006 | Okhonin et al. |
| 2006/0126374 A1 | 6/2006 | Waller et al. |
| 2006/0131650 A1 | 6/2006 | Okhonin et al. |
| 2006/0223302 A1 | 10/2006 | Chang et al. |
| 2006/0256606 A1 | 11/2006 | Park |
| 2006/0261401 A1* | 11/2006 | Bhattacharyya ............ 257/316 |
| 2007/0008811 A1 | 1/2007 | Keeth et al. |
| 2007/0023833 A1 | 2/2007 | Okhonin et al. |
| 2007/0045709 A1 | 3/2007 | Yang |
| 2007/0058427 A1 | 3/2007 | Okhonin et al. |
| 2007/0064489 A1 | 3/2007 | Bauser |
| 2007/0085140 A1 | 4/2007 | Bassin |
| 2007/0097751 A1 | 5/2007 | Popoff et al. |
| 2007/0114599 A1 | 5/2007 | Hshieh |
| 2007/0133330 A1 | 6/2007 | Ohsawa |
| 2007/0138524 A1* | 6/2007 | Kim et al. ............ 257/296 |
| 2007/0138530 A1 | 6/2007 | Okhonin et al. |
| 2007/0187751 A1 | 8/2007 | Hu et al. |
| 2007/0187775 A1 | 8/2007 | Okhonin et al. |
| 2007/0200176 A1 | 8/2007 | Kammler et al. |
| 2007/0252205 A1 | 11/2007 | Hoentschel et al. |
| 2007/0263466 A1 | 11/2007 | Morishita et al. |
| 2007/0278578 A1 | 12/2007 | Yoshida |
| 2008/0049486 A1 | 2/2008 | Gruening-von Schwerin |
| 2008/0083949 A1 | 4/2008 | Zhu et al. |
| 2008/0099808 A1 | 5/2008 | Burnett et al. |
| 2008/0130379 A1 | 6/2008 | Ohsawa |
| 2008/0133849 A1 | 6/2008 | Demi et al. |
| 2008/0144378 A1 | 6/2008 | Park et al. |
| 2008/0165577 A1 | 7/2008 | Fazan et al. |
| 2008/0251825 A1* | 10/2008 | Lee ............ G11C 11/403 257/297 |
| 2008/0251830 A1 | 10/2008 | Higashi et al. |
| 2008/0253179 A1 | 10/2008 | Slesazeck |
| 2008/0258206 A1 | 10/2008 | Hofmann |
| 2008/0277720 A1 | 11/2008 | Youn et al. |
| 2009/0086535 A1 | 4/2009 | Ferrant et al. |
| 2009/0121269 A1 | 5/2009 | Caillat et al. |
| 2009/0127592 A1 | 5/2009 | El-Kareh et al. |
| 2009/0127614 A1* | 5/2009 | Bhattacharyya ............ 257/325 |
| 2009/0161441 A1 | 6/2009 | Masuoka et al. |
| 2009/0201723 A1 | 8/2009 | Okhonin et al. |
| 2010/0085813 A1 | 4/2010 | Shino |
| 2010/0091586 A1 | 4/2010 | Carman |
| 2010/0110816 A1 | 5/2010 | Nautiyal et al. |
| 2010/0271857 A1 | 10/2010 | Luthra et al. |
| 2010/0271880 A1 | 10/2010 | Carman |

FOREIGN PATENT DOCUMENTS

| | | |
|---|---|---|
| EP | 0 350 057 | 1/1990 |
| EP | 0 354 348 | 2/1990 |
| EP | 0 202 515 | 3/1991 |
| EP | 0 207 619 | 8/1991 |
| EP | 0 175 378 | 11/1991 |
| EP | 0 253 631 | 4/1992 |
| EP | 0 513 923 | 11/1992 |
| EP | 0 300 157 | 5/1993 |
| EP | 0 564 204 | 10/1993 |
| EP | 0 579 566 | 1/1994 |
| EP | 0 362 961 | 2/1994 |

(56) References Cited

FOREIGN PATENT DOCUMENTS

| | | |
|---|---|---|
| EP | 0 599 506 | 6/1994 |
| EP | 0 359 551 | 12/1994 |
| EP | 0 366 882 | 5/1995 |
| EP | 0 465 961 | 8/1995 |
| EP | 0 694 977 | 1/1996 |
| EP | 0 333 426 | 7/1996 |
| EP | 0 727 820 | 8/1996 |
| EP | 731972 B1 | 9/1996 |
| EP | 0 739 097 | 10/1996 |
| EP | 744772 A1 | 11/1996 |
| EP | 0 245 515 | 4/1997 |
| EP | 788165 A2 | 8/1997 |
| EP | 0 801 427 | 10/1997 |
| EP | 0 510 607 | 2/1998 |
| EP | 844671 B1 | 5/1998 |
| EP | 0 537 677 | 8/1998 |
| EP | 0 858 109 | 8/1998 |
| EP | 0 860 878 | 8/1998 |
| EP | 0 869 511 | 10/1998 |
| EP | 0 878 804 | 11/1998 |
| EP | 920059 A2 | 6/1999 |
| EP | 924766 A2 | 6/1999 |
| EP | 0 642 173 | 7/1999 |
| EP | 0 727 822 | 8/1999 |
| EP | 0 933 820 | 8/1999 |
| EP | 951072 A1 | 10/1999 |
| EP | 0 971 360 | 1/2000 |
| EP | 0 980 101 | 2/2000 |
| EP | 0 601 590 | 4/2000 |
| EP | 0 993 037 | 4/2000 |
| EP | 0 836 194 | 5/2000 |
| EP | 0 599 388 | 8/2000 |
| EP | 0 689 252 | 8/2000 |
| EP | 0 606 758 | 9/2000 |
| EP | 0 682 370 | 9/2000 |
| EP | 1 073 121 | 1/2001 |
| EP | 0 726 601 | 9/2001 |
| EP | 1 162 744 | 12/2001 |
| EP | 1162663 A2 | 12/2001 |
| EP | 1 179 850 | 2/2002 |
| EP | 1 180 799 | 2/2002 |
| EP | 1 191 596 | 3/2002 |
| EP | 1 204 146 | 5/2002 |
| EP | 1 204 147 | 5/2002 |
| EP | 1 209 747 | 5/2002 |
| EP | 1 233 454 | 8/2002 |
| EP | 0 725 402 | 9/2002 |
| EP | 1 237 193 | 9/2002 |
| EP | 1 241 708 | 9/2002 |
| EP | 1 253 634 | 10/2002 |
| EP | 1 280 205 | 1/2003 |
| EP | 1 288 955 | 3/2003 |
| EP | 1482562 A2 | 12/2004 |
| FR | 2197494 A5 | 3/1974 |
| GB | 1 414 228 | 11/1975 |
| JP | H04-176163 A | 6/1922 |
| JP | S62-007149 A | 1/1987 |
| JP | 62-128567 | 6/1987 |
| JP | S62-272561 | 11/1987 |
| JP | 02-294076 A | 12/1990 |
| JP | 03-171768 | 7/1991 |
| JP | 04-093086 | 3/1992 |
| JP | 04-239177 B2 | 8/1992 |
| JP | H04-302477 A | 10/1992 |
| JP | 05-347419 | 12/1993 |
| JP | H08-148587 A | 6/1996 |
| JP | 08-213624 | 8/1996 |
| JP | H08-213624 A | 8/1996 |
| JP | 08-274277 | 10/1996 |
| JP | H08-316337 A | 11/1996 |
| JP | 09-046688 | 2/1997 |
| JP | 09-082912 | 3/1997 |
| JP | 10-242470 | 9/1998 |
| JP | H10-256510 A | 9/1998 |
| JP | 11-087649 | 3/1999 |
| JP | 12-389106 A | 12/2000 |
| JP | 2002-009081 A | 1/2002 |
| JP | 2002-083945 | 3/2002 |
| JP | 2002-094027 A | 3/2002 |
| JP | 2002-176154 A | 6/2002 |
| JP | 2002-246571 A | 8/2002 |
| JP | 2002-329795 A | 11/2002 |
| JP | 2002-343886 A | 11/2002 |
| JP | 2002-353080 A | 12/2002 |
| JP | 2003-031693 A | 1/2003 |
| JP | 2003-068877 A | 3/2003 |
| JP | 2003-068885 A | 3/2003 |
| JP | 2003-086712 A | 3/2003 |
| JP | 2003-100641 A | 4/2003 |
| JP | 2003-100900 A | 4/2003 |
| JP | 2003-132682 A | 5/2003 |
| JP | 2003-203967 A | 7/2003 |
| JP | 2003-243528 A | 8/2003 |
| JP | 2004-335553 | 11/2004 |
| JP | 2007527614 A | 9/2007 |
| JP | 2009-152498 A | 7/2009 |
| JP | 2012-247735 A | 12/2012 |
| WO | WO 01/24268 | 4/2001 |
| WO | WO 2005/008778 | 1/2005 |
| WO | WO-2006026159 A1 | 3/2006 |

OTHER PUBLICATIONS

Arimoto et al., A Configurable Enhanced T2RAM Macro for System-Level Power Management Unified Memory, 2006, VLSI Symposium.
Arimoto, A High-Density Scalable Twin Transistor RAM (TTRAM) With Verify Control for SOI Platform Memory IPs, Nov. 2007, Solid-State Circuits.
Asian Technology Information Program (ATIP) Scoops™, "Novel Capacitorless 1T-DRAM From Single-Gate PD-SOI to Double-Gate FinDRAM", May 9, 2005, 9 pages.
Assaderaghi et al., "A Dynamic Threshold Voltage MOSFET (DTMOS) for Ultra-Low Voltage Operation", IEEE IEDM, 1994, pp. 809-812.
Assaderaghi et al., "A Dynamic Threshold Voltage MOSFET (DTMOS) for Very Low Voltage Operation", IEEE Electron Device Letters, vol. 15, No. 12, Dec. 1994, pp. 510-512.
Assaderaghi et al., "A Novel Silicon-On-Insulator (SOI) MOSFET for Ultra Low Voltage Operation", 1994 IEEE Symposium on Low Power Electronics, pp. 58-59.
Assaderaghi et al., "Dynamic Threshold-Voltage MOSFET (DTMOS) for Ultra-Low Voltage VLSI", IEEE Transactions on Electron Devices, vol. 44, No. 3, Mar. 1997, pp. 414-422.
Assaderaghi et al., "High-Field Transport of Inversion-Layer Electrons and Holes Including Velocity Overshoot", IEEE Transactions on Electron Devices, vol. 44, No. 4, Apr. 1997, pp. 664-671.
Avci, Floating Body Cell (FBC) Memory for 16-nm Technology with Low Variation on Thin Silicon and 10-nm BOX, Oct. 2008, SOI Conference.
Bae, Evaluation of 1T RAM using Various Operation Methods with SOONO (Silicon-On-ONO) device, Dec. 2008, IEDM.
Ban et al., Integration of Back-Gate Doping for 15-nm Node Floating Body Cell (FBC) Memory, Components Research, Process Technology Modeling, presented in the 2010 VLSI Symposium on Jun. 17, 2010.
Ban, A Scaled Floating Body Cell (FBC) Memory with High-k+Metal Gate on Thin-Silicon and Thin-BOX for 16-nm Technology Node and Beyond, Jun. 2008, VLSI Symposium.
Ban, Ibrahim, et al., "Floating Body Cell with Independently-Controlled Double Gates for High Density Memory," Electron Devices Meeting, 2006. IEDM '06, International, IEEE, Dec. 11-13, 2006.
Bawedin, Maryline, et al., A Capacitorless 1T Dram on SOI Based on Dynamic Coupling and Double-Gate Operation, IEEE Electron Device Letters, vol. 29, No. 7, Jul. 2008.
Blagojevic et al., Capacitorless TR DRAM Sensing Scheme Automatice Reference Generation, 2006, IEEE J.Solid State Circuits.

(56) References Cited

OTHER PUBLICATIONS

Blalock, T., "A High-Speed Clamped Bit-Line Current-Mode Sense Amplifier", IEEE Journal of Solid-State Circuits, vol. 26, No. 4, Apr. 1991, pp. 542-548.
Butt, Scaling Limits of Double Gate and Surround Gate Z-RAM Cells, 2007, IEEE Trans. on El. Dev.
Chan et al., "Effects of Floating Body on Double Polysilicon Partially Depleted SOI Nonvolatile Memory Cell", IEEE Electron Device Letters, vol. 24, No. 2, Feb. 2003, pp. 75-77.
Chan, et al., "SOI MOSFET Design for All-Dimensional Scaling with Short Channel, Narrow Width and Ultra-thin Films", IEEE IEDM, 1995, pp. 631-634.
Chi et al., "Programming and Erase with Floating-Body for High Density Low Voltage Flash EEPROM Fabricated on SOI Wafers", Proceedings 1995 IEEE International SOI Conference, Oct. 1995, pp. 129-130.
Cho et al., "Novel DRAM Cell with Amplified Capacitor for Embedded Application", IEEE, Jun. 2009.
Cho, A novel capacitor-less DRAM cell using Thin Capacitively-Coupled Thyristor (TCCT), 2005, IEDM.
Choi et al., Current Flow Mechanism in Schottky-Barrier MOSFET and Application to the 1T-DRAM, 2008, SSDM.
Choi, High Speed Flash Memory and 1T-DRAM on Dopant Segregated Schottky Barrier (DSSB) FinFET SONOS Device for Multi-functional SoC Applications, Dec. 2008, IEDM.
Clarke, Junctionless Transistors Could Simply Chip Making, Say Researchers, EE Times, Feb. 2010, www.eetimes.com/showArticle.jhtml?articleID=223100050.
Colinge, J.P., "An SOI voltage-controlled bipolar-MOS device", IEEE Transactions on Electron Devices, vol. ED-34, No. 4, Apr. 1987, pp. 845-849.
Colinge, Nanowire Transistors Without Junctions, Nature NanoTechnology, vol. 5, 2010, pp. 225-229.
Collaert et al., Optimizing the Readout Bias for the Capacitorless 1T Bulk FinFET RAM Cell, 2009, IEEE EDL.
Collaert, Comparison of scaled floating body RAM architectures, Oct. 2008, SOI Conference.
Ershov, Optimization of Substrate Doping for Back-Gate Control in SOI T-RAM Memory Technology, 2005, SOI Conference.
Ertosun et al., A Highly Scalable Capacitorless Double Gate Quantum Well Single Transistor DRAM: 1T-QW DRAM, 2008, IEEE EDL.
Fazan et al., "A Simple 1-Transistor Capacitor-Less Memory Cell for High Performance Embedded DRAMs", IEEE 2002 Custom Integrated Circuits Conference, Jun. 2002, pp. 99-102.
Fazan, A Highly Manufacturable Capacitor-less 1T-DRAM Concept, 2002, SPIE.
Fazan, et al., "Capacitor-Less 1-Transistor DRAM", 2002 IEEE International SOI Conference, Oct. 2002, pp. 10-13.
Fazan, P., "MOSFET Design Simplifies DRAM", EE Times, May 14, 2002 (3 pages).
Fisch, Beffa, Bassin, Soft Error Performance of Z-RAM Floating Body Memory, 2006, SOI Conference.
Fisch, Carman, Customizing SOI Floating Body Memory Architecture for System Performance and Lower Cost, 2006, SAME.
Fisch, Z-RAM® Ultra-Dense Memory for 90nm and Below, 2006, Hot Chips.
Fossum et al., New Insights on Capacitorless Floating Body DRAM Cells, 2007, IEEE EDL.
Fujita, Array Architectureof Floating Body Cell (FBC) with Quasi-Shielded Open Bit Line Scheme for sub-40nm Node, 2008, SOI Conference.
Furuhashi, Scaling Scenario of Floating Body Cell (FBC) Suppressing Vth Variation Due to Random Dopant Fluctuation, Dec. 2008, SOI Conference.
Furuyama et al., "An Experimental 2-bit/Cell Storage DRAM for Macrocell or Memory-on-Logic Application", IEEE Journal of Solid-State Circuits, vol. 24, No. 2, Apr. 1989, pp. 388-393.
Giffard et al., "Dynamic Effects in SOI MOSFET's", IEEE, 1991, pp. 160-161.

Gupta et al., SPICE Modeling of Self Sustained Operation (SSO) to Program Sub-90nm Floating Body Cells, Oct. 2009, Conf on Simulation of Semiconductor Processes & Devices.
Han et al., Bulk FinFET Unified-RAM (URAM) Cell for Multifunctioning NVM and Capacitorless 1T-DRAM, 2008, IEEE EDL.
Han et al., Partially Depleted SONOS FinFET for Unified RAM (URAM) Unified Function for High-Speed 1T DRAM and Nonvolatile Memory, 2008, IEEE EDL.
Han, Energy Band Engineered Unified-RAM (URAM) for Multi-Functioning 1T-DRAM and NVM, Dec. 2008, IEDM.
Han, Parasitic BJT Read Method for High-Performance Capacitor-less 1T-DRAM Mode in Unified RAM, Oct. 2009, IEEE EDL.
Hara, Y., "Toshiba's DRAM Cell Piggybacks on SOI Wafer", EE Times, Jun. 2003.
Hu, C., "SOI (Silicon-on-Insulator) for High Speed Ultra Large Scale Integration", Jpn. J. Appl. Phys. vol. 33 (1994) pp. 365-369, Part 1, No. 1B, Jan. 1994.
Idei et al., "Soft-Error Characteristics in Bipolar Memory Cells with Small Critical Charge", IEEE Transactions on Electron Devices, vol. 38, No. 11, Nov. 1991, pp. 2465-2471.
Ikeda et al., "3-Dimensional Simulation of Turn-off Current in Partially Depleted SOI MOSFETs", IEIC Technical Report, Institute of Electronics, Information and Communication Engineers, 1998, vol. 97, No. 557 (SDM97 186-198), pp. 27-34.
Inoh et al., "FBC (Floating Body Cell) for Embedded DRAM on SOI", 2003 Symposium on VLSI Circuits Digest of Technical Papers, Jun. 2003 (2 pages).
Iyer et al., "SOI MOSFET on Low Cost SPIMOX Substrate", IEEE IEDM, Sep. 1998, pp. 1001-1004.
Jang et al., Highly scalable Z-RAM with remarkably long data retention for DRAM application, Jun. 2009, VLSI.
Jeong et al., "A Capacitor-less 1T DRAM Cell Based on a Surrounding Gate MOSFET with Vertical Channel", Technology Development Team, Technology Development Team, Samsung Electronics Co., Ltd., May 2007.
Jeong et al., "A New Capacitorless 1T DRAm Cell: Surrounding Gate MOSFET with Vertical Channel (SGVC Cell)", IEEE Transactions on Nanotechnology, vol. 6, No. 3, May 2007.
Jeong et al., "Capacitorless DRAM Cell with Highly Scalable Surrounding Gate Structure", Extended Abstracts of the 2006 International Conference on Solid State Devices and Materials, pp. 574-575, Yokohama (2006).
Jeong et al., "Capacitorless Dynamic Random Access Memory Cell with Highly Scalable Surrounding Gate Structure", Japanese Journal of Applied Physics, vol. 46, No. 4B, pp. 2143-2147 (2007).
Kedzierski, J.; "Design Analysis of Thin-Body Silicide Source/Drain Devices", 2001 IEEE International SOI Conference, Oct. 2001, pp. 21-22.
Kim et al., "Chip Level Reliability on SOI Embedded Memory", Proceedings 1998 IEEE International SOI Conference, Oct. 1998, pp. 135-139.
Kuo et al., "A Capacitorless Double-Gate DRAM Cell Design for High Density Applications", IEEE IEDM, Feb. 2002, pp. 843-846.
Kuo et al., "A Capacitorless Double-Gate DRAM Cell", IEEE Electron Device Letters, vol. 23, No. 6, Jun. 2002, pp. 345-347.
Kuo et al., A Capacitorless Double Gate DRAM Technology for Sub 100 nm Embedded and Stand Alone Memory Applications, 2003, IEEE Trans. on El. Dev.
Kwon et al., "A Highly Scalable 4F2 DRAm Cell Utilizing a Doubly Gated Vertical Channel", Extended Abstracts of the 2009 International Conference on Solid State Devices and Materials, UC Berkley, pp. 142-143 Sendai (2009).
Lee et al., "A Novel Pattern Transfer Process for Bonded SOI Giga-bit DRAMs", Proceedings 1996 IEEE International SOI Conference, Oct. 1996, pp. 114-115.
Leiss et al., dRAM Design Using the Taper-Isolated Dynamic RAM Cell, IEEE Transactions on Electron Devices, vol. ED-29, No. 4, Apr. 1982, pp. 707-714.
Lin et al., "Opposite Side Floating Gate SOI FLASH Memory Cell", IEEE, Mar. 2000, pp. 12-15.

(56) References Cited

OTHER PUBLICATIONS

Liu et al., Surface Generation-Recombination Processes of Gate and STI Oxide Interfaces Responsible for Junction Leakage on SOI, Sep. 2009, ECS Transactions, vol. 25.
Liu, Surface Recombination-Generation Processes of Gate, STI and Buried Oxide Interfaces, Responsible for Junction Leakage, ICSI, May 19, 2009.
Lončar et al., "One of Application of SOI Memory Cell-Memory Array", IEEE Proc. 22nd International Conference on Microelectronics (MIEL 2000), vol. 2, NIS, Serbia, May 14-17, 2000, pp. 455-458.
Lu et al., A Novel Two-Transistor Floating Body/Gate Cell for Low Power Nanoscale Embedded DRAM, 2008, IEEE Trans. on El. Dev.
Ma, et al., "Hot-Carrier Effects in Thin-Film Fully Depleted SOI MOSFET's", IEEE Electron Device Letters, vol. 15, No. 6, Jun. 1994, pp. 218-220.
Malhi et al., "Characteristics and Three-Dimensional Integration of MOSFET's in Small-Grain LPCVD Polycrystalline Silicon", IEEE Transactions on Electron Devices, vol. ED-32, No. 2, Feb. 1985, pp. 258-281.
Malinge, An 8Mbit DRAM Design Using a 1TBulk Cell, 2005, VLSI Circuits.
Mandelman et al, "Floating-Body Concerns for SOI Dynamic Random Access Memory (DRAM)", Proceedings 1996 IEEE International SOI Conference, Oct. 1996, pp. 136-137.
Matsuoka et al., FBC Potential of 6F2 Single Cell Operation in Multi Gbit Memories Confirmed by a Newly Developed Method for Measuring Signal Sense Margin, 2007, IEDM.
Minami, A Floating Body Cell (FBC) fully Compatible with 90nm CMOS Technology(CMOS IV) for 128Mb SOI DRAM, 2005, IEDM.
Mohapatra et al., Effect of Source/Drain Asymmetry on the Performance of Z-RAMò Devices, Oct. 2009, SOI conference.
Morishita, A Capacitorless Twin-Transistor Random Access Memory (TTRAM) on SOI, 2005, CICC.
Morishita, F. et al., "A Configurable Enhanced TTRAM Macro for System-Level Power Management Unified Memory", IEEE Journal of Solid-State Circuits, vol. 42, No. 4, pp. 853, Apr. 2007.
Morishita, F., et al., "A 312-MHz 16-Mb Random-Cycle Embedded DRAM Macro With a Power-Down Data Retention Mode for Mobile Applications", J. Solid-State Circuits, vol. 40, No. 1, pp. 204-212, 2005.
Morishita, F., et al., "Dynamic floating body control SOI CMOS for power managed multimedia ULSIs", Proc. CICC, pp. 263-266, 1997.
Morishita, F., et al., "Leakage Mechanism due to Floating Body and Countermeasure on Dynamic Retention Mode of SOI-DRAM", Symposium on VLSI Technology Digest of Technical Papers, pp. 141-142, 1995.
Nagoga, Studying of Hot Carrier Effect in Floating Body Soi Mosfets by the Transient Charge Pumping Technique, Switzerland 2003.
Nayfeh, A Leakage Current Model for SOI based Floating Body Memory that Includes the Poole-Frenkel Effect, 2008, SOI Conference.
Nemati, A Novel High Density, Low Voltage SRAM Cell with a Vertical NDR Device, 1998, VLSI Tech. Symp.
Nemati, A Novel Thyristor-based SRAM Cell (T-RAM) for High-Speed, Low-Voltage, Giga-scale Memories, 1999, IEDM Conference.
Nemati, Embedded Volatile Memories-Embedded Tutorial: The New Memory Revolution, New Drives Circuits and Systems, ICCAD 2008, Nov. 2008.
Nemati, Fully Planar 0.562μm2 T-RAM Cell in a 130nm SOI CMOS Logic Technology for High-Density High-Performance SRAMs, 2004, IEDM.
Nemati, The New Memory Revolution. New Devices, Circuits and Systems, 2008, ICCAD.
Nemati, Thyristor RAM (T-RAM): A High-Speed High-Density Embedded Memory Technology for Nano-scale CMOS, 2007, Hot Chips.
Nemati, Thyristor-RAM: A Novel Embedded Memory Technology that Outperforms Embedded S RAM/DRAM, 2008, Linley Tech Tour.
Nishiguchi et al., Long Retention of Gain-Cell Dynamic Random Access Memory with Undoped Memory Node, 2007, IEEE EDL.
Oh, Floating Body DRAM Characteristics of Silicon-On-ONO (SOONO) Devices for System-on-Chip (SoC) Applications, 2007, VLSI Symposium.
Ohno et al., "Suppression of Parasitic Bipolar Action in Ultra-Thin-Film Fully-Depleted CMOS/SIMOX Devices by Ar-Ion Implantation into Source/Drain Regions", IEEE Transactions on Electron Devices, vol. 45, No. 5, May 1998, pp. 1071-1076.
Ohsawa et al., "A Memory Using One-Transistor Gain Cell on SOI (FBC) with Performance Suitable for Embedded DRAM's", 2003 Symposium on VLSI Circuits Digest of Technical Papers, Jun. 2003 (4 pages).
Ohsawa et al., "Memory Design Using a One-Transistor Gain Cell on SOI", IEEE Journal of Solid-State Circuits, vol. 37, No. 11, Nov. 2002, pp. 1510-1522.
Ohsawa, A 128Mb Floating Body RAM (FBRAM) on SOI with a Multi-Averaging Scheme of Dummy Cell, 2006 Symposium of VLSI Circuits Digest of Tech Papers, (2006).
Ohsawa, An 18.5ns 128Mb SOI DRAM with a Floating Body Cell, 2005, ISSCC.
Ohsawa, Autonomous Refresh of Floating Body Cell (FBC), Dec. 2008, IEDM.
Ohsawa, Design of a 128-Mb SOI DRAM Using the Floating Body Cell (FBC), Jan. 2006, Solid-State Circuits.
Okhonin, A Capacitor-Less 1T-DRAM Cell, Feb. 2002, Electron Device Letters.
Okhonin, A SOI Capacitor-less 1T-DRAM Concept, 2001, SOI Conference.
Okhonin, Charge Pumping Effects in Partially Depleted SOI MOSFETs, 2003, SOI Conference.
Okhonin, New characterization techniques for SOI and related devices, 2003, ECCTD.
Okhonin, New Generation of Z-RAM, 2007, IEDM.
Okhonin, Principles of Transient Charge Pumping on Partially Depleted SOI MOSFETs, May 2002, Electron Device Letters.
Okhonin, Transient Charge Pumping for Partially and Fully Depleted SOI MOSFETs, 2002, SOI Conference.
Okhonin, Transient effects in PD SOI MOSFETs and potential DRAM applications, 2002, Solid-State Electronics.
Okhonin, Ultra-scaled Z-RAM cell, 2008, SOI Conference.
Okhonin, Z-RAM® (Limits of DRAM), 2009, ESSDERC.
Padilla, Alvaro, et al., "Feedback FET: A Novel Transistor Exhibiting Steep Switching Behavior at Low Bias Voltages," Electron Devices Meeting, 2008. IEDM 2008. IEEE International, Dec. 5-17, 2008.
Park, Fully Depleted Double-Gate 1T-DRAM Cell with NVM Function for High Performance and High Density Embedded DRAM, 2009, IMW.
Pelella et al., "Low-Voltage Transient Bipolar Effect Induced by Dynamic Floating-Body Charging in PD/SOI MOSFETs", Final Camera Ready Art, SOI Conference, Oct. 1995, 2 pages.
Portmann et al., "A SOI Current Memory for Analog Signal Processing at High Temperature", 1999 IEEE International SOI Conference, Oct. 1999, pp. 18-19.
Puget et al., 1T Bulk eDRAM using GIDL Current for High Speed and Low Power applications, 2008, SSDM.
Puget et al., Quantum effects influence on thin silicon film capacitor-less DRAM performance, 2006, SOI Conference.
Puget, FDSOI Floating Body Cell eDRAM Using Gate-Induced Drain-Leakage (GIDL) Write Current for High Speed and Low Power Applications, 2009, IMW.
Ranica et al., 1T-Bulk DRAM cell with improved performances: the way to scaling, 2005, ICMTD.
Ranica, A capacitor-less DRAM cell on 75nm gate length, 16nm thin Fully Depleted SOI device for high density embedded memories, 2004, IEDM.

(56) References Cited

OTHER PUBLICATIONS

Ranica, A One Transistor Cell on Bulk Substrate (1T-Bulk) for Low-Cost and High Density eDRAM, 2004, VLSI Symposium.
Rodder et al., "Silicon-On-Insulator Bipolar Transistors", IEEE Electron Device Letters, vol. EDL-4, No. 6, Jun. 1983, pp. 193-195.
Rodriguez, Noel, et al., A-RAM Novel Capacitor-less Dram Memory, SOI Conference, 2009 IEEE International, Oct. 5-8, 2009 pp. 1-2.
Roy, Thyristor-Based Volatile Memory in Nano-Scale CMOS, 2006, ISSCC.
Sailing et al., Reliability of Thyristor Based Memory Cells, 2009, IRPS.
Sasaki et al., Charge Pumping in SOS-MOS Transistors, 1981, IEEE Trans. on El. Dev.
Sasaki et al., Charge Pumping SOS-MOS Transistor Memory, 1978, IEDM.
Schloesser et al., "A 6F2 Buried Wordline DRAM Cell for 40nm and Beyond", IEEE, Qimonda Dresden GmbH & Co., pp. 809-812 (2008).
Shino et al., Floating Body RAM technology and its scalability to 32 nm node and beyond, 2006, IEDM.
Shino et al., Operation Voltage Dependence of Memory Cell Characteristics in Fully Depleted FBC, 2005, IEEE Trans. on El. Dev.
Shino, Fully-Depleted FBC (Floating Body Cell) with Enlarged Signal Window and Excellent Logic Process Compatibility, 2004, IEDM.
Shino, Highly Scalable FBC (Floating Body Cell) with 25nm BOX Structure for Embedded DRAM Applications, 2004, VLSI Symposium.
Sim et al., "Source-Bias Dependent Charge Accumulation in P+-Poly Gate SOI Dynamic Random Access Memory Cell Transistors", Jpn. J. Appl. Phys. vol. 37 (1998) pp. 1260-1263, Part 1, No. 3B, Mar. 1998.
Singh, A 2ns-Read-Latency 4Mb Embedded Floating-Body Memory Macro in 45nm SOI Technology, Feb. 2009, ISSCC.
Sinha et al., "In-Depth Analysis of Opposite Channel Based Charge Injection in SOI MOSFETs and Related Defect Creation and Annihilation", Elsevier Science, Microelectronic Engineering 28, 1995, pp. 383-386.
Song, 55 nm Capacitor-less 1T DRAM Cell Transistor with Non-Overlap Structure, Dec. 2008, IEDM.
Stanojevic et al., "Design of a SOI Memory Cell", IEEE Proc. 21st International Conference on Microelectronics (MIEL '97), vol. 1, NIS, Yugoslavia, Sep. 14-17, 1997, pp. 297-300.
Su et al., "Studying the Impact of Gate Tunneling on Dynamic Behaviors of Partially-Depleted SOI CMOS Using BSIMPD", IEEE Proceedings of the International Symposium on Quality Electronic Design (ISQED '02), Apr. 2002 (5 pages).
Suma et al., "An SOI-DRAM with Wide Operating Voltage Range by CMOS/SIMOX Technology", 1994 IEEE International Solid-State Circuits Conference, pp. 138-139.
Tack et al., "The Multi-Stable Behaviour of SOI-NMOS Transistors at Low Temperatures", Proc. 1988 SOS/SOI Technology Workshop (Sea Palms Resort, St. Simons Island, GA, Oct. 1988), p. 78.
Tack et al., "The Multistable Charge Controlled Memory Effect in SOI Transistors at Low Temperatures", IEEE Workshop on Low Temperature Electronics, Aug. 7-8, 1989, University of Vermont, Burlington, pp. 137-141.
Tack et al., "The Multistable Charge-Controlled Memory Effect in SOI MOS Transistors at Low Temperatures", IEEE Transactions on Electron Devices, vol. 37, No. 5, May 1990, pp. 1373-1382.
Tack, et al., "An Analytical Model for the Misis Structure in SOI MOS Devices", Solid-State Electronics vol. 33, No. 3, 1990, pp. 357-364.
Tanabe et al., A 30-ns 64-MB DRAM with Built-in-Self-Test and Self-Repair Function, IEEE Journal of Solid State Circuits, vol. 27, No. 11, Nov. 1992, pp. 1525-1533.
Tanaka et al., "Scalability Study on a Capacitorless 1T-DRAM: From Single-gate PD-SOI to Double-gate FINDRAM", 2004 IEEE, 4 pages.

Tang, Poren, Highly Scalable Capacitorless DRAM Cell on Thin-Body with Band-gap Engineered Source and Drain, Extended Abstracts of the 2009 ICSSDM, Sendai, 2009, pp. 144-145.
Terauchi et al., "Analysis of Floating-Body-Induced Leakage Current in 0.15µ m SOI DRAM", Proceedings 1996 IEEE International SOI Conference, Oct. 1996, pp. 138-139.
Thomas et al., "An SOI 4 Transistors Self-Refresh Ultra-Low-Voltage Memory Cell", IEEE, Mar. 2003, pp. 401-404.
Tomishima, et al., "A Long Data Retention SOI DRAM with the Body Refresh Function", IEICE Trans. Electron., vol. E80-C, No. 7, Jul. 1997, pp. 899-904.
Tsaur et al., "Fully Isolated Lateral Bipolar-MOS Transistors Fabricated in Zone-Melting-Recrystallized Si Films on SiO2", IEEE Electron Device Letters, vol. EDL-4, No. 8, Aug. 1983, pp. 269-271.
Tu, et al., "Simulation of Floating Body Effect in SOI Circuits Using BSIM3SOI", Proceedings of Technical Papers (IEEE Cat No. 97TH8303), Jun. 1997, pp. 339-342.
Villaret et al., "Mechanisms of Charge Modulation in the Floating Body of Triple-Well nMOSFET Capacitor-less DRAMs", Proceedings of the INFOS 2003, Insulating Films on Semiconductors, 13th Bi-annual Conference, Jun. 18-20, 2003, Barcelona (Spain), (4 pages).
Villaret et al., "Triple-Well nMOSFET Evaluated as a Capacitor-Less DRAM Cell for Nanoscale Low-Cost & High Density Applications", Handout at Proceedings of 2003 Silicon Nanoelectronics Workshop, Jun. 8-9, 2003, Kyoto, Japan (2 pages).
Villaret et al., Further Insight into the Physics and Modeling of Floating Body Capacitorless DRAMs, 2005, IEEE Trans. on El. Dev.
Wang et al., A Novel 4.5F2 Capacitorless Semiconductor Memory Device, 2008, IEEE EDL.
Wann et al., "A Capacitorless DRAM Cell on SOI Substrate", IEEE IEDM, 1993, pp. 635-638.
Wann et al., "High-Endurance Ultra-Thin Tunnel Oxide in MONOS Device Structure for Dynamic Memory Application", IEEE Electron Device Letters, vol. 16, No. 11, Nov. 1995, pp. 491-493.
Wei, A., "Measurement of Transient Effects in SOI DRAM/SRAM Access Transistors", IEEE Electron Device Letters, vol. 17, No. 5, May 1996, pp. 193-195.
Wouters, et al., "Characterization of Front and Back Si—SiO2 Interfaces in Thick- and Thin-Film Silicon-on-Insulator MOS Structures by the Charge-Pumping Technique", IEEE Transactions on Electron Devices, vol. 36, No. 9, Sep. 1989, pp. 1746-1750.
Wu, Dake, "Performance Improvement of the Capacitorless DRAM Cell with Quasi-SOI Structure Based on Bulk Substrate," Extended Abstracts of the 2009 ICSSDM, Sendai, 2009, pp. 146-147.
Yamanaka et al., "Advanced TFT SRAM Cell Technology Using a Phase-Shift Lithography", IEEE Transactions on Electron Devices, vol. 42, No. 7, Jul. 1995, pp. 1305-1313.
Yamauchi et al., "High-Performance Embedded SOI DRAM Architecture for the Low-Power Supply", IEEE Journal of Solid-State Circuits, vol. 35, No. 8, Aug. 2000, pp. 1169-1178.
Yamawaki, M., "Embedded DRAM Process Technology", Proceedings of the Symposium on Semiconductors and Integrated Circuits Technology, 1998, vol. 55, pp. 38-43.
Yang, Optimization of Nanoscale Thyristors on SOI for High-Performance High-Density Memories, 2006, SOI Conference.
Yoshida et al., "A Design of a Capacitorless 1-T-DRAM Cell Using Gate-induced Drain Leakage (GIDL) Current for Low-Power and High-speed Embedded Memory", 2003 IEEE, 4 pages.
Yoshida et al., "A Study of High Scalable DG-FinDRAM", IEEE Electron Device Letters, vol. 26, No. 9, Sep. 2005, pp. 655-657.
Yoshida et al., A Capacitorless 1T-DRAM Technology Using GIDL Current for Low Power and High Speed Embedded Memory, 2006, IEEE Trans. on El. Dev.
Yu et al., Hot-Carrier Effect in Ultra-Thin-Film (UTF) Fully-Depleted SOI MOSFET's, 54th Annual Device Research Conference Digest (Cat. No. 96TH8193), Jun. 1996, pp. 22-23.
Yu et al., "Hot-Carrier-Induced Degradation in Ultra-Thin-Film Fully-Depleted SOI MOSFETs", Solid-State Electronics, vol. 39, No. 12, 1996, pp. 1791-1794.

(56) References Cited

OTHER PUBLICATIONS

Yu et al., "Interface Characterization of Fully-Depleted SOI MOSFET by a Subthreshold I-V Method", Proceedings 1994 IEEE International SOI Conference, Oct. 1994, pp. 63-64.
Yun et al., Analysis of Sensing Margin in SOONO Device for the Capacitor-less RAM Applications, 2007, SOI Conference.
Zhou, Physical Insights on BJT-Based 1T DRAM Cells, IEEE Electron Device Letters, vol. 30, No. 5, May 2009.
European Supplementary Search Report corresponding to European Patent Application No. 12796567.1, dated Mar. 13, 2015, 11 pages.

* cited by examiner

|  | Erase FN tunnel | Erase Hot-h | Program FN tunnel | Program Hot-h | Read |
|---|---|---|---|---|---|
| Bit Line (CN<1>) | Open | 5 | 0 | 5 | 1 |
| Bit Line (CN<n>) | Open | 5 | 3 | 0 | 1 |
| WL1<0> | -16 | -11 | 16 | 11 | 3 |
| WL1<1> | -16 | -11 | 0 | -3 | -3 |
| WLn<0> | -16 | -11 | 0 | 0 | 0 |
| WLn<1> | -16 | -11 | 0 | 0 | 0 |
| Source Line (EN) | -1 | 0 | Open | 0 | 0 |
| Psub | 0 | 0 | 0 | 0 | 0 |

FIGURE 5

| | Erase FN Tunnel | Erase Hot-hole | Program FN Tunnel | Program Hot-electron | Read |
|---|---|---|---|---|---|
| Bit Line CN<1> | Open | 5 | 0 | 5 | 1 |
| Bit Line CN<n> | Open | 5 | 3 | 0 | 1 |
| WL<0> | -16 | -11 | 16 | 11 | 3 |
| WL<1> | -16 | -11 | 0 | -3 | -3 |
| WL<n> | -16 | -11 | 0 | 0 | 0 |
| Src<1> | -1 | 0 | 0 | 0 | 0 |
| Src<n> | -1 | 0 | Open | Open | Open |
| Psub | 0 | 0 | 0 | 0 | 0 |

FIGURE 9

SEMICONDUCTOR MEMORY DEVICE AND METHOD FOR BIASING SAME

FIELD OF THE DISCLOSURE

The present disclosure relates generally to semiconductor memory devices and, more particularly, to techniques for providing a semiconductor memory device.

BACKGROUND OF THE DISCLOSURE

The semiconductor industry has experienced technological advances that have permitted increases in density and/or complexity of semiconductor memory devices. Also, the technological advances have allowed decreases in power consumption and package sizes of various types of semiconductor memory devices. There is a continuing trend to employ and/or fabricate advanced semiconductor memory devices using techniques, materials, and devices that improve performance, reduce leakage current, and enhance overall scaling. Silicon-on-insulator (SOI) and bulk substrates are examples of materials that may be used to fabricate such semiconductor memory devices. Such semiconductor memory devices may include, for example, partially depleted (PD) devices, fully depleted (FD) devices, multiple gate devices (e.g., double, triple gate, or surrounding gate), and Fin-FET devices.

A semiconductor memory device may include a memory cell having a memory transistor with an electrically floating body region wherein electrical charge may be stored. When excess majority electrical charges carriers are stored in the electrically floating body region, the memory cell may store a logic high (e.g., binary "1" data state). When the electrical floating body region is depleted of majority electrical charge carriers, the memory cell may store a logic low (e.g., binary "0" data state). Also, a semiconductor memory device may be fabricated on silicon-on-insulator (SOI) substrates or bulk substrates (e.g., enabling body isolation). For example, a semiconductor memory device may be fabricated as a three-dimensional (3-D) device (e.g., a multiple gate device, a Fin-FET device, and a vertical pillar device).

In one conventional technique, the memory cell of the semiconductor memory device may be manufactured with many problems. For example, the conventional semiconductor memory device may have a channel length that may be susceptible to short-channel effects (SCE). Also, the conventional semiconductor memory device may experience interference between floating gates of adjacent memory cells. Further, the conventional semiconductor memory device may experience leakage of charge carriers stored in the memory cell due to memory cell noises and variations.

In view of the foregoing, it may be understood that there may be significant problems and shortcomings associated with conventional techniques for providing a semiconductor memory device.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be illustrative only.

FIG. 5 shows voltage potential levels of various methods for performing a write operation and a read operation on a memory cell as shown in FIGS. 2-4 in accordance with an embodiment of the present disclosure.

FIG. 9 shows voltage potential levels of various methods for performing a write operation and a read operation on a memory cell as shown in FIGS. 6-8 in accordance with an embodiment of the present disclosure.

DETAILED DESCRIPTION OF EMBODIMENTS

Figure 1:
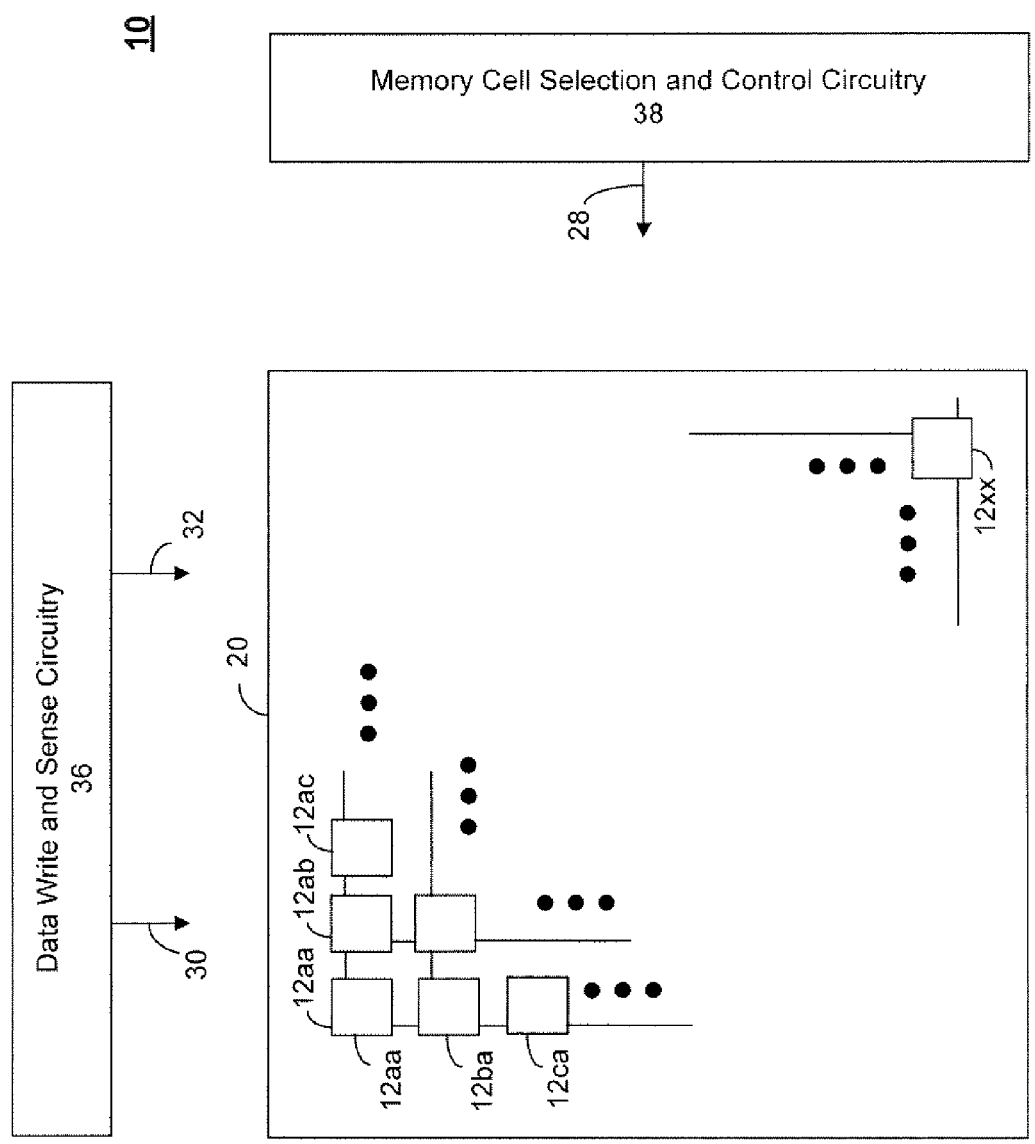
FIG. 1 shows a block diagram of a semiconductor memory device including a memory cell array, data write and sense circuitry, and memory cell selection and control circuitry in accordance with an embodiment of the present disclosure.

Referring to FIG. 1, there is shown a block diagram of a semiconductor memory device 10 comprising a memory cell array 20, data write and sense circuitry 36, and memory cell selection and control circuitry 38 in accordance with an embodiment of the present disclosure. The memory cell array 20 may comprise a plurality of memory cells 12 each coupled to the memory cell selection and control circuitry 38 via a word line (WL) 28, and to the data write and sense circuitry 36 via a bit line (CN) 30 and a source line (EN) 32. It may be appreciated that the bit line (CN) 30 and the source line (EN) 32 are designations used to distinguish between two signal lines and they may be used interchangeably.

The data write and sense circuitry 36 may read data from and may write data to selected memory cells 12. In a particular embodiment, the data write and sense circuitry 36 may include a plurality of data sense amplifier circuits. Each data sense amplifier circuit may receive at least one bit line (CN) 30 and a current or voltage reference signal. For example, each data sense amplifier circuit may be a cross-coupled type sense amplifier to sense a data state stored in a memory cell 12. The data write and sense circuitry 36 may include at least one multiplexer that may couple to a data sense amplifier circuit to at least one bit line (CN) 30. In a particular embodiment, the multiplexer may couple a plurality of bit lines (CN) 30 to a data sense amplifier circuit.

Each data sense amplifier circuit may employ voltage and/or current sensing circuitry and/or techniques. In a particular embodiment, each data sense amplifier circuit may employ current sensing circuitry and/or techniques. For example, a current sense amplifier may compare current from a selected memory cell 12 to a reference current (e.g., the current of one or more reference cells). From that comparison, it may be determined whether the selected memory cell 12 stores a logic high (e.g., binary "1" data state) or a logic low (e.g., binary "0" data state). It may be appreciated by one having ordinary skill in the art that various types or forms of the data write and sense circuitry 36 (including one or more sense amplifiers, using voltage or current sensing techniques, to sense a data state stored in a memory cell 12) may be employed to read data stored in the memory cells 12.

The memory cell selection and control circuitry 38 may select and/or enable one or more predetermined memory cells 12 to facilitate reading data therefrom by applying control signals on one or more word lines (WL) 28. The memory cell selection and control circuitry 38 may generate such control signals from address signals, for example, row address signals. Moreover, the memory cell selection and control circuitry 38 may include a word line decoder and/or driver. For example, the memory cell selection and control circuitry 38 may include one or more different control/selection techniques (and circuitry thereof) to select and/or enable one or more predetermined memory cells 12. Notably, all such control/selection techniques, and circuitry thereof, whether now known later developed, are intended to fall within the scope of the present disclosure.

In a particular embodiment, the semiconductor memory device 10 may implement a two step write operation whereby all the memory cells 12 in a row of memory cells 12 may be written to a predetermined data state by first executing a "clear" or a logic low (e.g., binary "0" data state) write operation, whereby all of the memory cells 12 in the row of memory cells 12 are written to logic low (e.g., binary "0" data state). Thereafter, selected memory cells 12 in the row of memory cells 12 may be selectively written to the predetermined data state (e.g., a logic high (binary "1" data state)). The semiconductor memory device 10 may also implement a one step write operation whereby selected memory cells 12 in a row of memory cells 12 may be selectively written to either a logic high (e.g., binary "1" data state) or a logic low (e.g., binary "0" data state) without first implementing "clear" operation. The semiconductor memory device 10 may employ any of the illustrative writing, preparation, holding, refresh, and/or reading techniques described herein.

The memory cells 12 may comprise N-type, P-type and/or both types of transistors. Circuitry that is peripheral to the memory cell array 20 (for example, sense amplifiers or comparators, row and column address decoders, as well as line drivers (not illustrated herein)) may also include P-type and/or N-type transistors. Regardless of whether P-type or N-type transistors are employed in memory cells 12 in the memory cell array 20, suitable voltage potentials (for example, positive or negative voltage potentials) for reading from the memory cells 12 will be described further herein.

Figure 2:
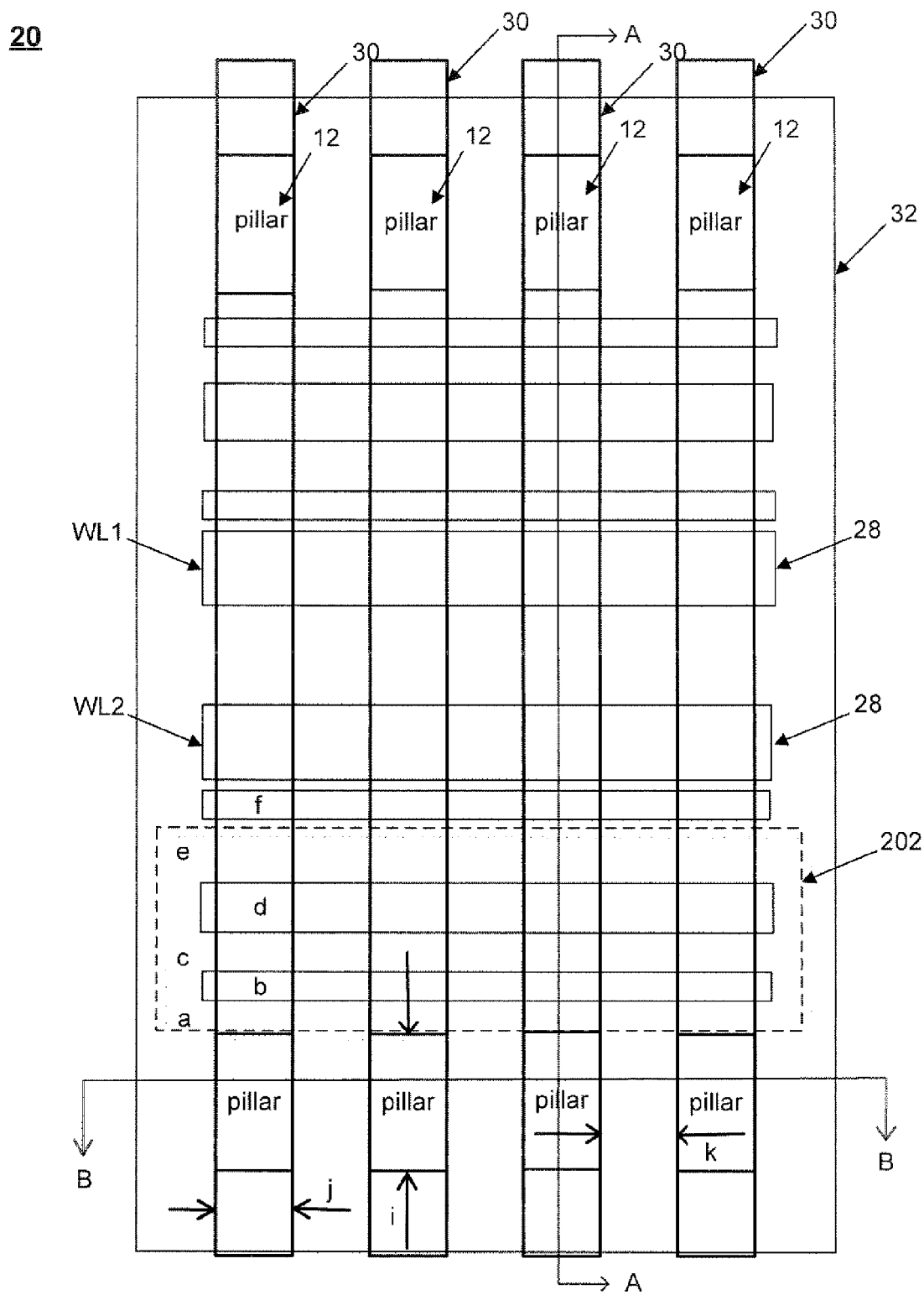
FIG. 2 shows a top view of at least a portion of the memory cell array shown in FIG. 1 in accordance with an embodiment of the present disclosure.

Referring to FIG. 2, there is shown a top view of at least a portion of the memory cell array 20 shown in FIG. 1 in accordance with an embodiment of the present disclosure. As illustrated in the top view, the memory cell array 20 may include a plurality of memory cells 12 arranged in a matrix of rows and columns including a plurality of word lines 28 (WL), plurality of bit lines (CN) 30, and/or a source line plate (EN) 32. Each bit line (CN) 30 may extend in a first orientation along a first plane of the memory cell array 20. The source line plate (EN) 32 may extend in the first orientation and a second orientation along a second plane of the memory cell array 20. Each word line (WL) 28 may extend in the second orientation along a third plane of the memory cell array 20. The first plane, the second plane, and the third plane of the memory cell array 20 may be arranged in different planes parallel to each other.

The plurality of word lines (WL) 28 may be formed of a polycide material (e.g., a combination of a metal material and a silicon material), a metal material, and/or a combination of a polycide material and a metal material. In a particular embodiment, the word lines (WL) 28 may capacitively couple a voltage potential/current source of the memory cell selection and control circuitry 38 to the memory cells 12. The word line (WL) 28 may be formed of a plurality layers. Each layer of the word line (WL) 28 may be formed of different materials having various thicknesses. In a particular embodiment, the first layer (f) of the word line (WL) 28 may be formed of a silicon material having a thickness of approximately 10 nm. The second layer (g) of the word line (WL) 28 may be formed of a metal material having a thickness of approximately 10 nm. In a particular embodiment, the first word line (WL1) 28 may implement a write logic low (e.g., binary "0" data state) operation on the memory cell 12, while the second word line (WL2) 28 may implement a write logic high (e.g., binary "1" data state) operation. In a particular embodiment, the first word line (WL1) 28 and the second word line (WL2) 28 may be spaced apart from each other at approximately 25 nm.

The plurality of word lines (WL) 28 may be an electrically capacitively coupled to a plurality of memory cells 12 via a tunneling insulating layer 202. The tunneling insulating layer 202 may comprise a plurality of insulating or dielectric layers. In a particular embodiment, the tunneling insulating layer 202 may comprise a thermal oxide layer 202(a), a nitride layer 202(b), an oxide layer 202(c), a charge trapping nitride layer 202(d) (e.g., silicon nitride), and/or a blocking oxide layer 202(e). The plurality of insulating or dielectric layers of the tunneling insulating layer 202 may comprise of various thickness. In a particular embodiment, the thermal oxide layer 202(a) may have a thickness of approximately 1.5 nm, the nitride layer 202(b) may have a thickness of approximately 2 nm, the oxide layer 202(c) may have a thickness of approximately 2.5 nm, the charge trapping nitride layer 202(d) (e.g., silicon nitride) may have a thickness of approximately 5 nm, and/or the blocking oxide layer 202(e) may have a thickness of approximately 5 nm.

The memory cell 12 may be configured to maximize scaling of memory cells 12 in the semiconductor memory device 10. In a particular embodiment, the memory cell 12 may be configured to have a width (i) (e.g., along the direction of the bit line (CN) 30) of approximately 40 nm. The width (i) of the memory cell 12 may be limited by floating gate to floating gate interference and inversion layer interference. The spacing (K) between contiguous row of memory cells 12 (e.g., along the direction of the word line (WL) 28) may be approximately F nm, wherein F may be the minimum space possible. The memory cell 12 may be configured to have a width (j) (e.g., along the direction of the word line (WL) 28) of approximately F nm, wherein F may be the minimum space possible.

Figure 3:
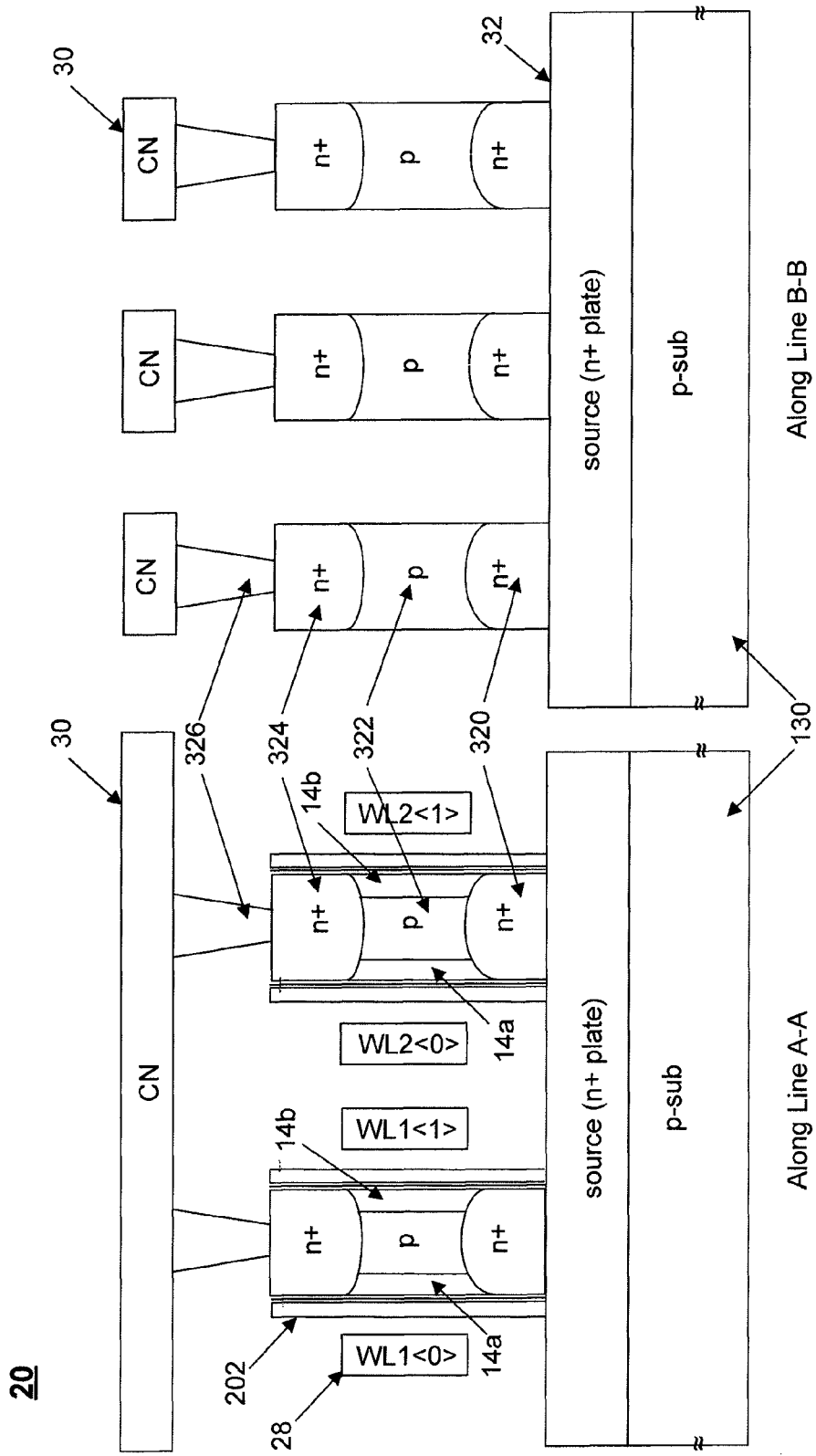
FIG. 3 shows cross-sectional views of at least a portion of the memory cell array as shown in FIG. 2 in accordance with an embodiment of the present disclosure.

Referring to FIG. 3, there are shown cross-sectional views of at least a portion of the memory cell array 20 as shown in FIG. 2 in accordance with an embodiment of the present disclosure. FIG. 3 illustrates a cross-sectional view of at least a portion of the memory cell array 20 along line A-A and a cross-sectional view of at least a portion of the memory cell array 20 along line B-B. The memory cells 12 of the memory cell array 20 may be implemented in a vertical configuration having various regions. For example, the memory cell 12 may comprise a source region 320, a body region 322, and a drain region 324. The source region 320, the body region 322, and/or the drain region 324 may be disposed in a sequential contiguous relationship, and may extend vertically from a plane defined by a P− substrate 130. The source region 320 of the memory cell 12 may be coupled to the source line (EN) 32. The body region 322 may be an electrically floating body region of the memory cell configured to accumulate/store charges, and may be spaced apart from and capacitively coupled to the plurality of word lines (WL) 28 via the tunneling insulating layer 202. The drain region 324 of the memory cell 12 may be coupled to the bit line (CN) 30.

The source region 320 of the memory cell 12 may be coupled to a corresponding source line (EN) 32. In a particular embodiment, the source region 320 may be formed of a semiconductor material (e.g., silicon) comprising donor impurities. For example, the source region 320 may be formed of a silicon material doped with phosphorous or arsenic impurities. In a particular embodiment, the source region 320 may be formed of a silicon material doped with phosphorous or arsenic having a concentration of approximately $10^{20}$ atoms/cm$^3$ or above. The source region 320 may comprise a plate having continuous planar region configured above the P− substrate 130. The source region 320 may also comprise a plurality of protrusions formed on the continuous planar region of the plate. The plurality of protrusions of the source region 320 may be oriented in a column direction and/or a row direction of the memory cell array 20. The plurality of protrusions of the source region 320 may form the base of the memory cell 12.

In a particular embodiment, the source line (EN) 32 may be configured as the plate having continuous planar region of the source region 320. In a particular embodiment, the source line (EN) 32 may be formed of an N+ doped silicon layer. In another embodiment, the source line (EN) 32 may be formed of a metal material. In other embodiments, the source line (EN) 32 may be formed of a polycide material (e.g., a combination of a metal material and a silicon material). The source line (EN) 32 may couple a predetermined voltage potential to the memory cells 12 of the memory cell array 20. For example, the source line (EN) 32 may be coupled to a plurality of memory cells 12 (e.g., a column or a row of memory cell array 20).

The body region 322 of the memory cell 12 may be capacitively coupled to a corresponding word lines (WL) 28 via the tunneling insulating layer 202. In a particular embodiment, the body region 322 may be formed of a semiconductor material (e.g., silicon) comprising acceptor impurities. The body region 322 may be formed of a silicon material doped with boron impurities. In a particular embodiment, the body region 322 may be formed of a silicon material with acceptor impurities having a concentration of $10^{15}$ atoms/cm$^3$. In a particular embodiment, the body region 322 may comprise a first floating body region 14a and a second floating body region 14b. The first floating body region 14a and the second floating body region 14b may accumulate/store charge carriers in order to represent a data state (e.g., a logic low (e.g., binary "0" data state) and/or a logic high (e.g., binary "1" data state)). The first floating body region 14a and the second floating body region 14b may be spaced apart and capacitively coupled to the plurality of word lines (WL) 28.

The word lines (WL) 28 may be capacitively coupled the body region 322. The word lines (WL) 28 may be oriented in a row direction of the memory cell array 20 and coupled to a plurality of memory cells 12. The word lines (WL) 28 may be arranged on the sides of the memory cells 12 (e.g., memory cells 12 located on a row direction of the memory cell array 20). For example, the word lines (WL) 28 may be arranged on at least two side portions of the memory cells 12. The first word line (WL1) 28 may be arranged on a first side portion of the memory cells 12 and the second word line (WL2) 28 may be arranged on a second side portion of the memory cells 12. The first side portion and the second side portion may be opposite side portions of the memory cells 12.

The drain region 324 of the memory cell 12 may be coupled to a corresponding bit line (CN) 30. In a particular embodiment, the drain region 324 of the memory cell 12 may be formed of a semiconductor material (e.g., silicon) comprising donor impurities. For example, the drain region 324 may be formed of a silicon material doped with phosphorous or arsenic impurities. In a particular embodiment, the drain region 324 may be formed of a silicon material doped with phosphorous or arsenic having a concentration of approximately $10^{20}$ atoms/cm$^3$ or above.

The bit line (CN) 30 may be coupled to the drain region 324 of the memory cell 12. The bit line (CN) 30 may be formed of a metal material. In another embodiment, the bit line (CN) 30 may be formed of a polycide material (e.g., a combination of a metal material and a silicon material). In other embodiments, the bit line (CN) 30 may be formed of an N+ doped silicon layer. For example, the bit line (CN) 30 may be coupled to a plurality of memory cells 12. The bit line (CN) 30 may be configured above the drain region 324.

The bit line (CN) 30 may be connected to a plurality of memory cells 12 (e.g., a column of memory cells 12) via a plurality of bit line contacts 326. For example, each bit line contact 326 may correspond to a memory cell 12 along a column direction of the memory cell array 20. Each bit line contact 326 may be formed of a metal layer or a polysilicon layer in order to couple a voltage potential from the bit line (CN) 30 to the drain region 324 of the memory cell 12. For example, the bit line contact 326 may be formed of tungsten, titanium, titanium nitride, polysilicon or a combination thereof. The bit line contact 326 may have a height extending from the bit line (CN) 30 to the drain region 324 of the memory cell 12.

In a particular embodiment, the P− substrate 130 may be made of a semiconductor material (e.g., silicon) comprising acceptor impurities and may form a base of the memory cell array 20. For example, the P− substrate 130 may be made of a semiconductor material comprising boron impurities. In a particular embodiment, the P− substrate 130 may be made of silicon comprising boron impurities having a concentration of approximately $10^{15}$ atoms/cm$^3$. In alternative embodiments, a plurality of P− substrates 130 may form the base of the memory cell array 20 or a single P− substrate 130 may form the base of the memory cell array 20. Also, the P− substrate 130 may be made in the form of a P-well substrate.

Figure 4:
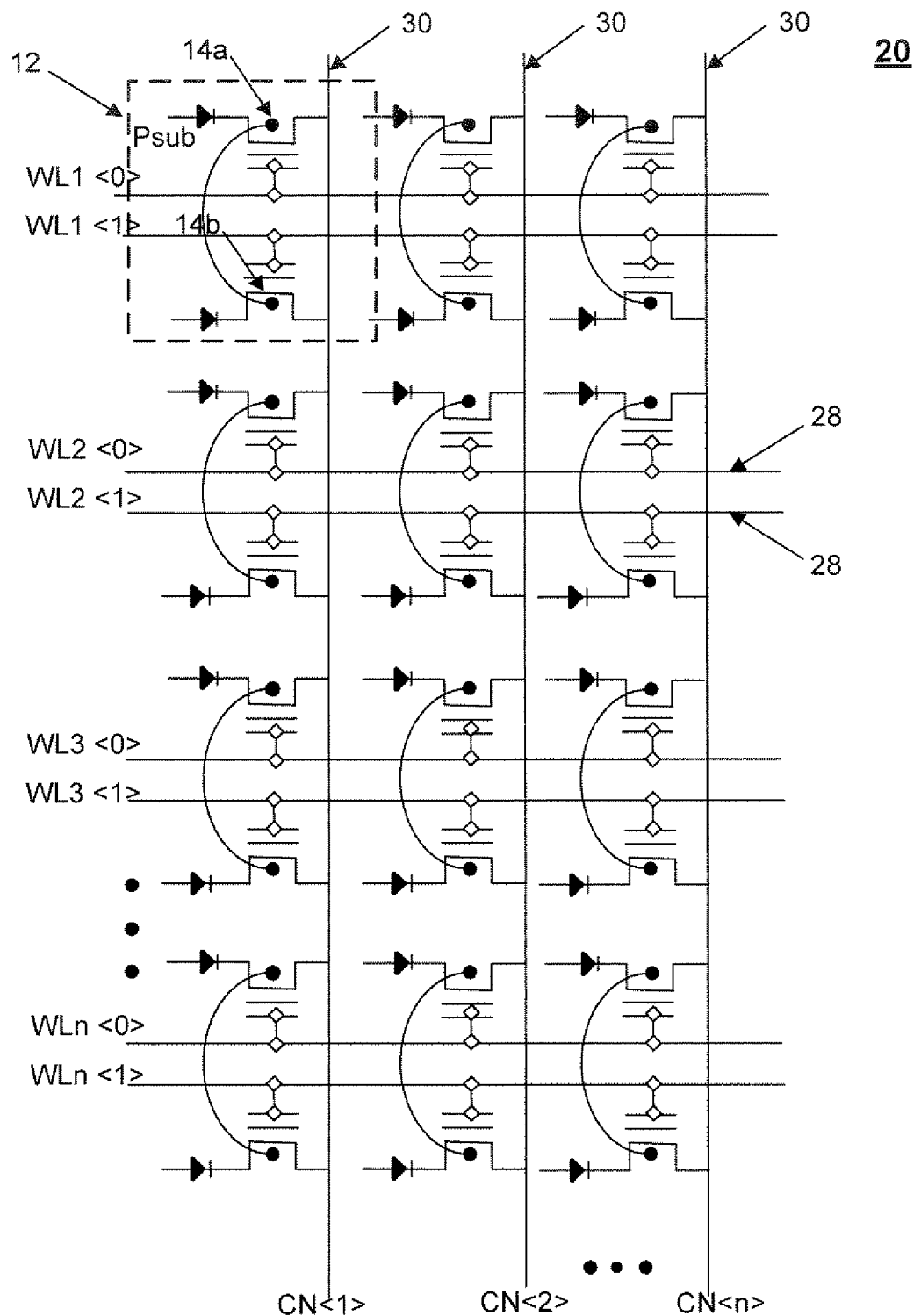
FIG. 4 shows a schematic view of at least a portion of the memory cell array having a plurality of memory cells in accordance with an embodiment of the present disclosure.

Referring to FIG. 4, there is shown a schematic view of at least a portion of the memory cell array 20 having a plurality of memory cells 12 in accordance with an embodiment of the present disclosure. The memory cells 12 may be coupled to a corresponding plurality of word lines (WL) 28, a corresponding bit line (CN) 30, and/or a corresponding source line (EN) 32. The plurality of word lines (WL) 28 may comprise a first word line (WL<0>) and a second word line (WL<1>) capacitively coupled to the memory cell 12 via the tunneling insulating layer 202. Each of the memory cells 12 may comprise a first floating body region 14a and a second floating body region 14b coupled to each other. The first floating body region 14a and the second floating body region 14b may be different regions of the body region 322 of the memory cell 12. In a particular embodiment, the first floating body region 14a may be capacitively coupled to the first word line (WL1<0>) via the tunneling insulating layer

202. The second floating body region 14*b* may be capacitively coupled to the second word line (WL1<1>) via the tunneling insulating layer 202.

Data may be written to or read from a selected memory cell 12 by applying suitable control signals to a selected word line (WL) 28, a selected bit line (CN) 30, and/or a selected source line (EN) 32. For example, a data state (e.g., a logic low (e.g., binary "0" data state) and/or a logic high (e.g., binary "1" data state)) may be written to the first floating body region 14*a* and the second floating body region 14*b*. The same data state or different data state may be simultaneously written to the first floating body region 14*a* and the second floating body region 14*b*. The same data state or different data state may be sequentially written to the first floating body region 14*a* and the second floating body region 14*b*. Also, a data state may be simultaneously or sequentially read from the first floating body region 14*a* and the second floating body region 14*b*.

In a particular embodiment, one or more respective bit line (CN) 30 may be coupled to one or more data sense amplifiers of the data write and sense circuitry 36. For example, one or more control signals may be applied to one or more selected memory cells 12 via a selected plurality of word lines (WL) 28, a selected bit line (CN) 30, and/or a selected source line (EN) 32. A voltage and/or a current may be generated by the first floating body region 14*a* and/or the second floating body region 14*b* of the one or more selected memory cells 12 and outputted to the data write and sense circuitry 36 via a corresponding bit line (CN) 30. Also, a data state may be written to the first floating body region 14*a* and/or the second floating body region 14*b* of the one or more selected memory cells 12 by applying one or more control signals via one or more corresponding plurality of word lines (WL) 28, one or more corresponding bit lines (CN) 30, and/or one or more corresponding source line (EN) 32. One or more control signals applied via the corresponding first word line (WL<0>) 28 may control the first floating body region 14*a* of the memory cell 12 in order to write a desired data state to the memory cell 12. One or more control signals applied via the corresponding second word line (WL<1>) 28 may control the second floating body region 14*b* of the memory cell 12 in order to write a desired data state to the memory cell 12. In the event that a data state is read from and/or written to the memory cell 12 via the bit line (CN) 30, the bit line (CN) 30 may be coupled to the data sense amplifier of the data write and sense circuitry 36 while the source line (EN) 32 may be separately controlled via a voltage/current source (e.g., a voltage/current driver) of the data write and sense circuitry 36. In a particular embodiment, the data sense amplifier of the data write and sense circuitry 36 and the voltage/current source of the data write and sense circuitry 36 may be configured on opposite sides of the memory cell array 20.

Referring to FIG. 5, there is shown voltage potential levels of various methods for performing a write operation and a read operation on a memory cell 12 as shown in FIGS. 2-4 in accordance with an embodiment of the present disclosure. The write operation may include a write logic low (e.g., binary "0" data state) operation and a write logic high (e.g., binary "1" data state) operation. In a particular embodiment, the various methods of performing a write logic low (e.g., binary "0" data state) operation may comprise an erase forward node tunneling write operation and/or an erase hot-hole write operation. In another embodiment, the various methods of performing a write logic high (e.g., binary "1" data state) operation may comprise a program forward node tunneling write operation and/or a program hot-electron write operation.

The erase forward node tunneling write operation may perform a write logic low (e.g., binary "0" data state) operation by depleting charge carriers (e.g., electrons) stored in the memory cell 12. During the erase forward node tunneling write operation, the P− substrate 130 may be coupled to an electrical ground (e.g., 0V). The plurality of bit lines (CN) 30 may be decoupled from a voltage potential source and/or current source and may be electrical open or electrically floating. A negative voltage potential may be applied to the source region 320. The negative voltage potential applied to the source region 320 may forward bias the junction between the source region 320 and the P− substrate 130. In a particular embodiment, the negative voltage potential applied to the source region 320 may be −1.0V. Simultaneously to or after forward biasing the junction between the source region 320 and the P− substrate 130, a negative voltage potential may be applied to the plurality of word lines (WL) 28 (e.g., that may be capacitively coupled to the floating body regions 14*a* and 14*b* of the body region 322). The negative voltage potential applied to the plurality of word lines (WL) 28 may tunnel electrons that may have accumulated/stored in the charge trapping region 202(*d*) via the forward biased junction between the source region 320 and the P− substrate 130. By driving out the electrons that may have accumulated/stored in the charge trapping region 202(*d*), a logic low (e.g., binary "0" data state) may be written to the memory cell 12.

The erase hot-hole write operation may perform a write logic low (e.g., binary data state) operation by accumulate/store minority charge carriers (e.g., holes) in order to compensate for the majority charge carriers (e.g., electrons) that may have accumulated/stored in the memory cell 12. During the erase hot-hole operation, the P− substrate 130 and the source region 320 may be coupled to an electrical ground (e.g., 0V). Thus, the junction between the P− substrate 130 and the source region 320 may remain in reversed biased or weakly forward biased (e.g., above a reverse bias voltage and below a forward bias threshold voltage potential). A positive voltage potential may be applied to the drain region 324 via the bit line (CN) 30. In a particular embodiment, the positive voltage potential applied to the drain region 324 may be 5.0V. Also, a negative voltage potential may be applied to the plurality of word lines (WL) 28 (e.g., that are capacitively coupled to the body region 322 via the tunneling insulating layer 202). In a particular embodiment, the negative voltage potential applied to the plurality of word lines (WL) 28 (e.g., that may be capacitively coupled to the body region 322 via the tunneling insulating layer 202) may be −11.0V.

The positive voltage potential applied to the drain region 324 and the negative voltage potential applied to the plurality of word lines (WL) 28 may create a band-to-band tunneling (gate-induced drain leakage "GIDL") effect between the drain region 324 and the body region 322. Due to the band-to-band tunneling (gate-induced drain leakage "GIDL") effect, minority charge carriers (e.g., holes) may be injected into the charge trapping layer 202(*d*) by the negative voltage potential applied to the plurality of word lines (WL) 28. A predetermined amount of minority charge carriers (e.g., holes) may be accumulated/stored in the charge trapping region 202(*d*) of the memory cell 12. The predetermined amount of minority charge carriers (e.g., holes) that may be accumulated/stored in the charge trapping region 202(*d*) may outnumber the amount of majority charge carriers (e.g., electrons) that may be accumulated/stored in the charge trapping region 202(d). The predetermine amount of minority charge carriers (e.g., holes) accumulated/stored in the charge trapping region 202(d) of the memory cell 12 may represent that a logic low (e.g., binary "0" data state) may be stored in the memory cell 12.

The program forward node tunneling write operation may perform a write logic high (e.g., binary "1" data state) operation by injecting majority charge carriers into the memory cell 12. During the program forward node tunneling write operation, the P− substrate 130 may be coupled to an electrical ground (e.g., 0V) and the drain region 324 may be coupled to an electrical ground (e.g., 0V). The source region 320 of the memory cell 12 may be decoupled from a voltage potential source/current source and may be electrically floating (e.g., open). A positive voltage potential may be applied to the plurality of word lines (WL) 28 (e.g., that may be capacitively coupled the body region 322 of the memory cell 12 via the tunneling insulating layer 202). In a particular embodiment, the positive voltage potential applied to the plurality of word lines (WL) 28 may be 16.0V.

The positive voltage potential applied to the plurality of word lines (WL) 28 may switch the memory transistor (e.g., comprising source region 320, body region 322, and/or drain region 324) to an "ON" state. The positive voltage potential applied to the plurality of word lines (WL) 28 may cause a predetermined amount of majority charge carriers (e.g., electrons) to be injected into the body region 322 of the memory cell 12 when the memory transistor (e.g., comprising the source region 320, the body region 322, and/or the drain region 324) is turned to an "ON" state. The predetermined amount of majority charge carriers (e.g., electrons) may be tunneled into and accumulated/stored in the charge trapping region 202(d) to represent that a logic high (e.g., binary "1" data state) is stored in the memory cell 12.

For an unselected memory cell 12, the voltage potential applied to the plurality of word lines (WL) 28 may be coupled to an electrical ground (e.g., 0V). A positive voltage potential may be applied to the drain region 324 via the bit line (CN) 30. In a particular embodiment, the positive voltage potential applied to the drain region 324 may be 3.0V. The memory transistor (e.g., comprising the source region 320, the body region 322, and the drain region 324) may be turned to an "OFF" state. No majority charge carriers or a small amount of majority charge carriers (e.g., electrons) may be injected into the body region 322 of the memory cell 12. Thus, the program forward node tunnel write operation may not be performed on the unselected memory cell 12.

The program hot-electron write operation may perform a write logic high (e.g., binary "1" data state) operation by accumulating/storing majority charge carriers (e.g., electrons) in the memory cell 12. During the program hot-electron write operation, the P− substrate 130 may be coupled to an electrical ground (e.g., 0V) and the source region 320 may be coupled to an electrical ground (e.g., 0V). The junction between the P− substrate 130 and the source region 320 may be reversed biased or weakly forward biased (e.g., above a reverse bias voltage and below a forward bias threshold voltage potential). A positive voltage potential may be applied to the drain region 324 via the bit line (CN) 30. In a particular embodiment, the positive voltage potential applied to the drain region 324 via the bit line (CN) 30 may be 5.0V.

A positive voltage potential may be applied to the first word line (WL1<0>) 28 that may be capacitively coupled to the first floating body region 14a of the body region 322. A negative voltage potential may be applied to the second word line (WL1<1>) 28 that may be capacitively coupled to the second floating body region 14b of the body region 322. The positive voltage potential applied to the drain region 324 and the word line (WL1<0>) 28 may create a band-to-band tunneling (gate-induced drain leakage "GIDL") effect between the drain region 324 and the body region 322. A predetermined amount of majority charge carrier (e.g., electrons) may be tunneled into the charge trapping region 202(d). The positive voltage potential applied to the first word line (WL1<0>) (e.g., that may be capacitively coupled to the first floating body region 14a of the body region 322) may accumulate/store the majority charge carriers (e.g., electrons) in the charge trapping region 202(d) of the first floating body region 14a. The negative voltage potential applied to the second word line (WL1<1>) 28 may repel majority charge carriers (e.g., electrons) injected into the first floating body region 14a of the body region 322. The predetermined amount of majority charge carriers (e.g., electrons) stored in the first floating body region 14a of the body region 322 may represent that a logic high (e.g., binary "1" data state) is stored in the memory cell 12.

A read operation may be performed to read a data state (e.g., a logic low (e.g., binary "0" data state) and/or a logic high (e.g., binary "1" data state)) stored in the memory cell 12. During a read operation, the P− substrate 130 may be coupled to an electrical ground (e.g., 0V) and the source region 320 may be coupled to an electrical ground (e.g., 0V). A positive voltage potential may be applied to the drain region 324 of the memory cell 12 via the bit line (CN) 30. In a particular embodiment, the positive voltage potential applied to the drain region 324 may be 1.0V. A positive voltage potential may be applied to the first word line (WL1<0>) 28 that may be capacitively coupled to the first floating body region 14a of the body region 322 via the tunneling insulating layer 202. A negative voltage potential may be applied to the second word line (WL1<1>) 28 that may be capacitively coupled to the second floating body region 14b of the body region 322 via the tunneling insulating layer 202. In a particular embodiment, the positive voltage potential applied to the first word line (WL1<0>) 28 that may be capacitively coupled to the first floating body region 14a may be 3.0V. In another embodiment, the negative voltage potential applied to the second word line (WL1<1>) 28 that may be capacitively coupled to the second floating body region 14b may be −3.0V.

Under such biasing, the memory transistor (e.g., comprising the source region 320, the body region 322, and/or the drain region 324) may be turned to an "ON" state via the first floating body region 14a and the drain region 324. The memory transistor may be turned to an "OFF" state via the second floating body region 14b and the drain region 324. The majority charge carriers (e.g., electrons) may flow from the first floating body region 14b to the drain region 324 when the memory transistor (e.g., comprising the source region 320, the body region 322, and/or the drain region 324) is turned to an "ON" state. In a particular embodiment, when a logic low (e.g., binary "0" data state) is stored in the memory cell 12, a predetermined amount of voltage potential and/or current may be detected at the drain region 324. In another embodiment, when a logic high (e.g., binary "1" data state) is stored in the memory cell 12, no voltage potential and/or current may be detected at the drain region 324.

Figure 6:
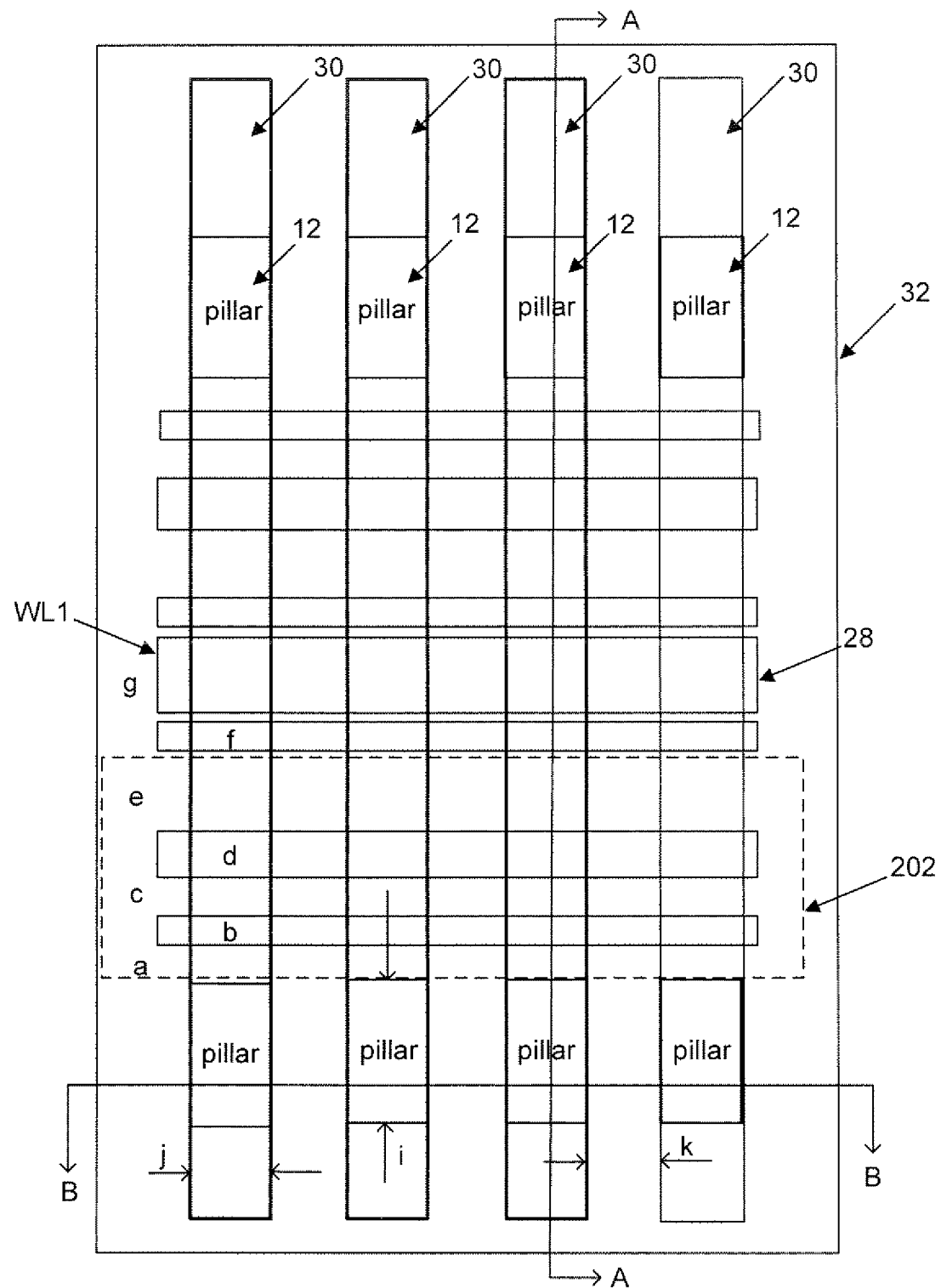
FIG. 6 shows a top view of at least a portion of the memory cell array as shown in FIG. 1 in accordance with an alternate embodiment of the present disclosure.

Referring to FIG. 6, there is shown a top view of at least a portion of the memory cell array 20 as shown in FIG. 1 in accordance with an alternate embodiment of the present disclosure. As illustrated in the top view, the memory cell array 20 may include a plurality of memory cells 12 arranged in a matrix of rows and columns including a plurality of word lines (WL), a plurality of bit lines (CN) 30, and/or a source line stripe (EN) 32. Each bit line (CN) 30 may extend in a first orientation along a first plane of the memory cell array 20. The source line strip (EN) 32 may extend in a second orientation along a second plane of the memory cell array 20. Each word line (WL) 28 may extend in the second orientation along a third plane of the memory cell array 20. The first plane, the second plane, and the third plane of the memory cell array 20 may be arranged in different planes parallel to each other.

The plurality of word lines (WL) 28 may be formed of a polycide material (e.g., a combination of a metal material and a silicon material), a metal material, and/or a combination of a polycide material and a metal material. In a particular embodiment, the word lines (WL) 28 may capacitively couple a voltage potential/current source of the memory cell selection and control circuitry 38 to the memory cells 12. The word line (WL) 28 may be formed of a plurality layers. Each layer of the word line (WL) 28 may be formed of different materials having various thicknesses. In a particular embodiment, the first layer (f) of the word line (WL) 28 may be formed of a silicon material having a thickness of approximately 1 nm. The second layer (g) of the word line (WL) 28 may be formed of a metal material having a thickness of approximately 10 nm. In a particular embodiment, the word line (WL) 28 may be arranged between two contiguous memory cells 12 and capacitively coupled to the two contiguous memory cells 12. For example, the word line (WL) 28 may implement an operation simultaneously to the two contiguous memory cells 12.

The plurality of word lines (WL) 28 may be an electrically capacitively coupled to a plurality of memory cells 12 via a tunneling insulating layer 202. The tunneling insulating layer 202 may comprise a plurality of insulating or dielectric layers. In a particular embodiment, the tunneling insulating layer 202 may comprise a thermal oxide layer 202(*a*), a nitride layer 202(*b*), an oxide layer 202(*c*), a charge trapping nitride layer 202(*d*) (e.g., silicon nitride), and/or a blocking oxide layer 202(*e*). The plurality of insulating or dielectric layers of the tunneling insulating layer 202 may comprise of various thickness. In a particular embodiment, the thermal oxide layer 202(*a*) may have a thickness of approximately 1.5 nm, the nitride layer 202(*b*) may have a thickness of approximately 2 nm, the oxide layer 202(*c*) may have a thickness of approximately 2.5 nm, the charge trapping nitride layer 202(*d*) (e.g., silicon nitride) may have a thickness of approximately 5 nm, and/or the blocking oxide layer 202(*e*) may have a thickness of approximately 5 nm.

The memory cell 12 may be configured to maximize scaling of memory cells 12 in the semiconductor memory device 10. In a particular embodiment, the memory cell 12 may be configured to have a width (i) (e.g., along the direction of the bit line (CN) 30) of approximately 40 nm. The width (i) of the memory cell 12 may be limited by floating gate to floating gate interference and inversion layer interference. The spacing (K) between contiguous row of memory cells 12 (e.g., along the direction of the word line (WL) 28) may be approximately F nm, wherein F may be the minimum space possible. The memory cell 12 may be configured to have a length (j) (e.g., along the direction of the word line (WL) 28) of approximately F, wherein F may be the minimum space possible nm.

Figure 7:
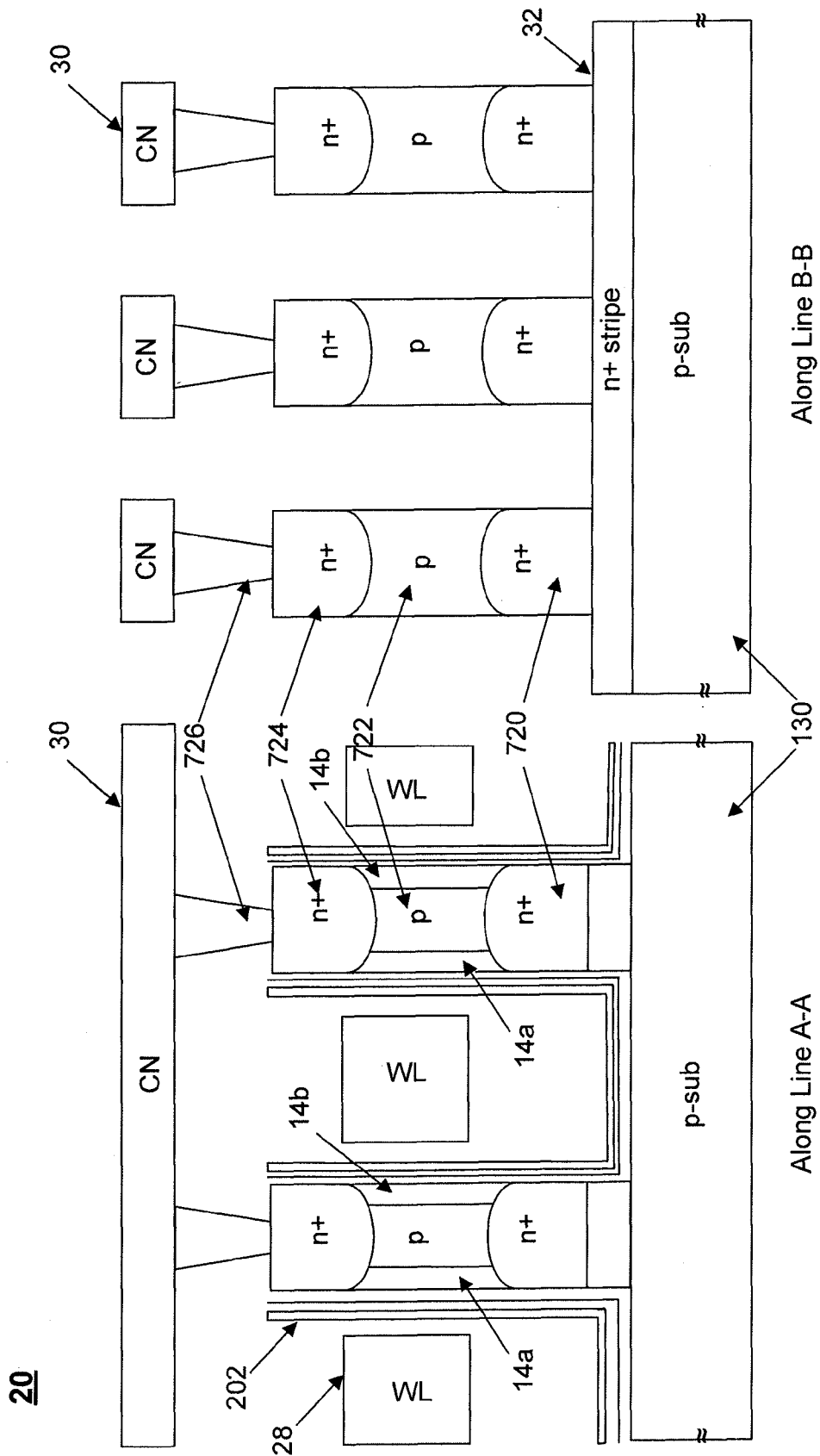
FIG. 7 shows cross-sectional views of at least a portion of the memory cell array as shown in FIG. 6 in accordance with an embodiment of the present disclosure.

Referring to FIG. 7, there are shown cross-sectional views of at least a portion of the memory cell array 20 as shown in FIG. 6 in accordance with an embodiment of the present disclosure. FIG. 7 illustrates a cross-sectional view of at least a portion of the memory cell array 20 along line A-A and a cross-sectional view of at least a portion of the memory cell array 20 along line B-B. The memory cells 12 of the memory cell array 20 may be implemented in a vertical configuration having various regions. For example, the memory cell 12 may comprise a source region 720, a body region 722, and a drain region 724. The source region 720, the body region 722, and/or the drain region 724 may be disposed in a sequential contiguous relationship, and may extend vertically from a plane defined by a P− substrate 130. The source region 720 of the memory cell 12 may be coupled to the source line (EN) 32. The body region 722 may be an electrically floating body region of the memory cell 12 configured to accumulate/store charges, and may be spaced apart from and capacitively coupled to the plurality of word lines (WL) 28 via the tunneling insulating layer 202. The drain region 724 of the memory cell 12 may be coupled to the bit line (CN) 30.

The source region 720 of the memory cell 12 may be coupled to a corresponding source line (EN) 32. In a particular embodiment, the source region 720 may be formed of a semiconductor material (e.g., silicon) comprising donor impurities. For example, the source region 720 may be formed of a silicon material doped with phosphorous or arsenic impurities. In a particular embodiment, the source region 720 may be formed of a silicon material doped with phosphorous or arsenic having a concentration of approximately $10^{20}$ atoms/cm$^3$ or above. The source region 720 may comprise a strip region having an elongated continuous planar region configured above the P− substrate 130. The elongated continuous planar region of the source region 720 may form a column or a row of the memory cell array 20. The source region 720 may also comprise a plurality of protrusions formed on the elongated continuous planar region. The plurality of protrusions of the source region 720 may be oriented in a column direction and/or a row direction of the memory cell array 20. The plurality of protrusions of the source region 720 may form the base of the memory cell 12.

In a particular embodiment, the source line (EN) 32 may be coupled to the elongated continuous planar region of the source region 720. In a particular embodiment, the source line (EN) 32 may be formed of an N+ doped silicon layer. In another embodiment, the source line (EN) 32 may be formed of a metal material. In other embodiments, the source line (EN) 32 may be formed of a polycide material (e.g., a combination of a metal material and a silicon material). The source line (EN) 32 may couple a predetermined voltage potential to the memory cells 12 of the memory cell array 20. For example, the source line (EN) 32 may be coupled to a plurality of memory cells 12 (e.g., a column or a row of memory cell array 20).

The body region 722 of the memory cell 12 may be capacitively coupled to a corresponding word lines (WL) 28 via the tunneling insulating layer 202. The tunneling insulating layer 202 may be formed between contiguous memory cells 12 surrounding the corresponding word line (WL) 28 configured between the contiguous memory cells 12. In a particular embodiment, the body region 722 may be formed of a semiconductor material (e.g., silicon) comprising acceptor impurities. The body region 722 may be formed of a silicon material doped with boron impurities. In a particular embodiment, the body region 722 may be formed of a silicon material with acceptor impurities having a concentration of approximately $10^{15}$ atoms/cm$^3$. In a particular embodiment, the body region 722 may comprise a first floating body region 14a and a second floating body region 14b. The first floating body region 14a and the second floating body region 14b may accumulate/store charge carriers in order to represent a data state (e.g., a logic low (e.g., binary "0" data state) and/or a logic high (e.g., binary "1" data state)).

The word lines (WL) 28 may be capacitively coupled the body region 722. The word lines (WL) 28 may be oriented in a row direction of the memory cell array 20 and coupled to a plurality of memory cells 12. The word lines (WL) 28 may be arranged on the sides of the memory cells 12 (e.g., memory cells 12 located on a row direction of the memory cell array 20). For example, the word lines (WL) 28 may be arranged on a side portion of the memory cells 12. For example, the word line (WL) 28 may be capacitively coupled to a first floating body region 14a of the body region 722 of the first memory cell 12 and capacitively coupled to a second floating body region 14b of the body region 722 of the second memory cell 12. Thus, the word line (WL) 28 may be arranged between the first memory cell 12 and the second memory cell 12.

The drain region 724 of the memory cell 12 may be coupled to a corresponding bit line (CN) 30. In a particular embodiment, the drain region 724 of the memory cell 12 may be formed of a semiconductor material (e.g., silicon) comprising donor impurities. For example, the drain region 724 may be formed of a silicon material doped with phosphorous or arsenic impurities. In a particular embodiment, the drain region 724 may be formed of a silicon material doped with phosphorous or arsenic having a concentration of approximately $10^{20}$ atoms/cm$^3$ or above.

The bit line (CN) 30 may be coupled to the drain region 724 of the memory cell 12. The bit line (CN) 30 may be formed of a metal material. In another embodiment, the bit line (CN) 30 may be formed of a polycide material (e.g., a combination of a metal material and a silicon material). In other embodiments, the bit line (CN) 30 may be formed of an N+ doped silicon layer. For example, the bit line (CN) 30 may be coupled to a plurality of memory cells 12. The bit line (CN) 30 may be configured above the drain region 724.

The bit line (CN) 30 may be connected to a plurality of memory cells 12 (e.g., a column of memory cells 12) via a plurality of bit line contacts 726. For example, each bit line contact 726 may correspond to a memory cell 12 along a column direction of the memory cell array 20. Each bit line contact 726 may be formed of a metal layer or a polysilicon layer in order to couple a voltage potential from the bit line (CN) 30 to the drain region 724 of the memory cell 12. For example, the bit line contact 726 may be formed of tungsten, titanium, titanium nitride, polysilicon or a combination thereof. The bit line contact 726 may have a height extending from the bit line (CN) 30 to the drain region 724 of the memory cell 12.

In a particular embodiment, the P– substrate 130 may be made of a semiconductor material (e.g., silicon) comprising acceptor impurities and may form a base of the memory cell array 20. For example, the P– substrate 130 may be made of a semiconductor material comprising boron impurities. In a particular embodiment, the P– substrate 130 may be made of silicon comprising boron impurities having a concentration of approximately $10^{15}$ atoms/cm$^3$. In alternative embodiments, a plurality of P– substrates 130 may form the base of the memory cell array 20 or a single P– substrate 130 may form the base of the memory cell array 20. Also, the P– substrate 130 may be made in the form of a P-well substrate.

Figure 8:
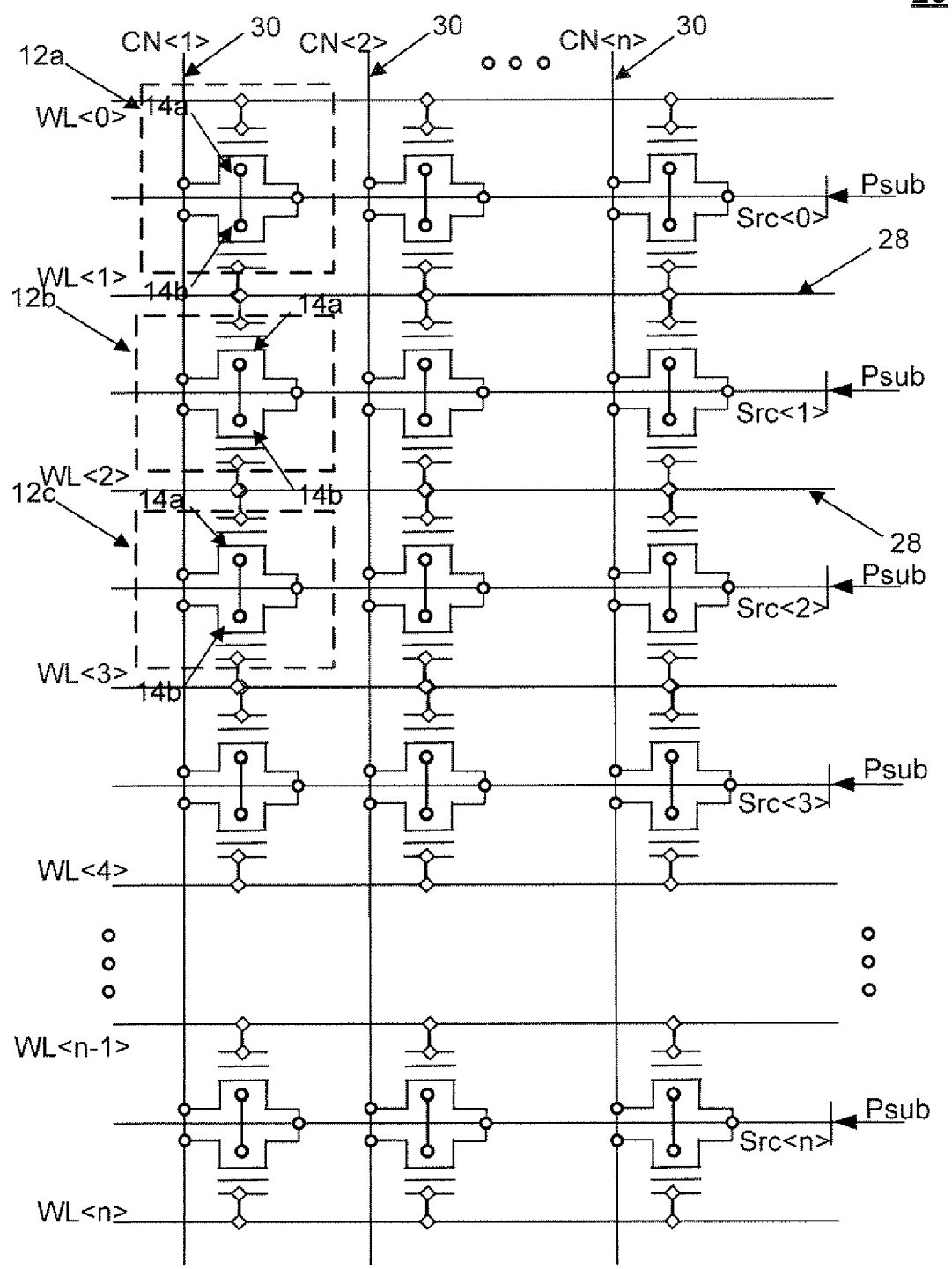
FIG. 8 shows a schematic diagram of at least a portion of the memory cell array having a plurality of memory cells in accordance with an alternate embodiment of the present disclosure.

Referring to FIG. 8, there is shown a schematic diagram of at least a portion of the memory cell array 20 having a plurality of memory cells 12 in accordance with an alternate embodiment of the present disclosure. The memory cells 12 may be coupled to a corresponding word line (WL) 28, a corresponding bit line (CN) 30, and/or a corresponding source line (EN) 32. The word line (WL) 28 may be capacitively coupled to a plurality of memory cells 12 via the tunneling insulating layer 202. In a particular embodiment, the word line (WL1) 28 may be capacitively coupled to the second floating body region 14b of the first memory cell 12a. Also, the word line (WL1) may be capacitively coupled to the first floating body region 14a of the second memory cell 12b.

Data may be written to or read from a selected memory cell 12 by applying suitable control signals to a selected word line (WL) 28, a selected bit line (CN) 30, and/or a selected source line (EN) 32. For example, a data state (e.g., a logic low (e.g., binary "0" data state) and/or a logic high (e.g., binary "1" data state)) may be written to the first floating body region 14a and the second floating body region 14b. The same data state or different data state may be simultaneously written to two contiguous memory cells 12. In a particular embodiment, the same data state or different data state may be simultaneously written to the second floating body region 14b of the first memory cell 12b and the first floating body region 14b of the second memory cell 12b. The same data state or different data state may be sequentially written to contiguous memory cells 12. In a particular embodiment, the same data state or different data state may be sequentially written to the second floating body region 14b of the first memory cell 12a and the first floating body region 14a of the second memory cell 12b. Also, a data state may be simultaneously or sequentially read from the first floating body region 14a and the second floating body region 14b.

In a particular embodiment, one or more respective bit line (CN) 30 may be coupled to one or more data sense amplifiers of the data write and sense circuitry 36. For example, one or more control signals may be applied to one or more selected memory cells 12 via a selected word line (WL) 28, a selected bit line (CN) 30, and/or a selected source line (EN) 32. A voltage potential and/or a current may be generated by the first floating body region 14a and/or the second floating body region 14b of the one or more selected memory cells 12 and outputted to the data write and sense circuitry 36 via a corresponding bit line (CN) 30. Also, a data state may be written to the first floating body region 14a and/or the second floating body region 14b of the one or more selected memory cells 12 by applying one or more control signals via one or more corresponding word lines (WL) 28, one or more corresponding bit lines (CN) 30, and/or one or more corresponding source line (EN) 32. One or more control signals applied via a corresponding word line (WL1) 28 may control the second floating body region 14b of the first memory cell 12a and the first floating body region 14a of the second memory cell 12b in order to write a desired data state to the memory cell 12. One or more control signals applied via the corresponding second word line (WL2) 28 may control the second floating body region 14b of the second memory cell 12b and the first floating body region 14a of the third memory cell 12c in order to write a desired data state to the memory cells 12. In the event that a data state is read from and/or written to the memory cell 12 via the bit line (CN) 30, the bit line (CN) 30 may be coupled to the data sense amplifier of the data write and sense circuitry 36 while the source line (EN) 32 may be separately controlled via a voltage/current source (e.g., a voltage/current driver) of the data write and sense circuitry 36. In a particular embodiment, the data sense amplifier of the data write and sense circuitry 36 and the voltage/current source of the data write and sense circuitry 36 may be configured on opposite sides of the memory cell array 20.

Referring to FIG. 9, there is shown voltage potential levels of various methods for performing a write operation and a read operation on a memory cell 12 as shown in FIGS. 6-8 in accordance with an embodiment of the present disclosure. The write operation may include a write logic low (e.g., binary "0" data state) operation and a write logic high (e.g., binary "1" data state) operation. In a particular embodiment, the various methods of performing a write logic low (e.g., binary "0" data state) operation may comprise an erase forward node tunneling write operation and/or an erase hot-hole write operation. In another embodiment, the various methods of performing a write logic high (e.g., binary "1" data state) operation may comprise a program forward node tunneling write operation and/or a program hot-electron write operation.

The erase forward node tunneling write operation may perform a write logic low (e.g., binary "0" data state) operation by depleting charge carriers (e.g., electrons) stored in the memory cell 12. During the erase forward node tunneling write operation, the P− substrate 130 may be coupled to an electrical ground (e.g., 0V). The plurality of bit lines (CN) 30 may be decoupled from a voltage potential source and/or current source and may be electrical open or electrically floating. A negative voltage potential may be applied to the source region 720. The negative voltage potential applied to the source region 720 may forward bias the junction between the source region 720 and the P− substrate 130. In a particular embodiment, the negative voltage potential applied to the source region 720 may be −1.0V. Simultaneously to or after forward biasing the junction between the source region 720 and the P− substrate 130, a negative voltage potential may be applied to the plurality of word lines (WL) 28 (e.g., that may be capacitively coupled to the floating body regions 14a and 14b of the body region 722). The negative voltage potential applied to the plurality of word lines (WL) 28 may tunnel electrons that may have accumulated/stored the charge trapping region 202(d) via the forward biased junction between the source region 720 and the P− substrate 130. By driving out the electrons that may have accumulated/stored in the charge trapping region 202(d), a logic low (e.g., binary "0" data state) may be written to the memory cell 12.

The erase hot-hole write operation may perform a write logic low (e.g., binary "0" data state) operation by accumulate/store minority charge carriers (e.g., holes) in order to compensate for the majority charge carriers (e.g., electrons) that may have accumulated/stored in the memory cell 12. During the erase hot-hole operation, the P− substrate 130 and the source region 720 may be coupled to an electrical ground (e.g., 0V). Thus, the junction between the P− substrate 130 and the source region 720 may remain in reversed biased or weakly forward biased (e.g., above a reverse bias voltage and below a forward bias threshold voltage potential). A positive voltage potential may be applied to the drain region 724 via the bit line (CN) 30. In a particular embodiment, the positive voltage potential applied to the drain region 724 may be 5.0V. Also, a negative voltage potential may be applied to the plurality of word lines (WL) 28 (e.g., that are capacitively coupled to the body region 722 via the tunneling insulating layer 202). In a particular embodiment, the negative voltage potential applied to the plurality of word lines (WL) 28 (e.g., that may be capacitively coupled to the body region 722 via the tunneling insulating layer 202) may be −11.0V.

The positive voltage potential applied to the drain region 724 and the negative voltage potential applied to the plurality of word lines (WL) 28 may create a band-to-band tunneling (gate-induced drain leakage "GIDL") effect between the drain region 724 and the body region 722. Due to the band-to-band tunneling (gate-induced drain leakage "GIDL") effect, minority charge carriers (e.g., holes) may be injected into the charge trapping region 202(d) by the negative voltage potential applied to the plurality of word lines (WL) 28. A predetermined amount of minority charge carriers (e.g., holes) may be accumulated/stored in the charge trapping region 202(d) of the memory cell 12. The predetermined amount of minority charge carriers (e.g., holes) that may be accumulated/stored in the charge trapping region 202(d) may outnumber the amount of majority charge carriers (e.g., electrons) that may be accumulated/stored in the charge trapping region 202(d). The predetermine amount of minority charge carriers (e.g., holes) accumulated/stored in the charge trapping region 202(d) of the memory cell 12 may represent that a logic low (e.g., binary "0" data state) may be stored in the memory cell 12.

The program forward node tunneling write operation may perform a write logic high (e.g., binary "1" data state) operation by injecting majority charge carriers (e.g., electrons) into the memory cell 12. During the program forward node tunneling write operation, the P− substrate 130 may be coupled to an electrical ground (e.g., 0V), the selected source region (Src<1>) 720 may be coupled to an electrical ground (e.g., 0V), and the selected drain region (CN1) 724 may be coupled to an electrical ground (e.g., 0V). The unselected source region (Src<n>) 720 of the memory cell 12 may be decoupled from a voltage potential source/current source and may be electrically floating (e.g., open). A positive voltage potential may be applied to the selected word line (WL0) 28 (e.g., that may be capacitively coupled the body region 722 of the memory cell 12 via the tunneling insulating layer 202). In a particular embodiment, the positive voltage potential applied to the selected word line (WL0) 28 may be 16.0V.

The positive voltage potential applied to the selected word line (WL0) 28 may turn the memory transistor (e.g., comprising the source region 720, the body region 722, and/or the drain region 724) to an "ON" state. The positive voltage potential applied to the selected word line (WL0) 28 may cause a predetermined amount of majority charge carriers (e.g., electrons) to be injected into the body region 722 of the memory cell 12 when the memory transistor (e.g., comprising the source region 720, the body region 722, and/or the drain region 724) is turned to an "ON" state. The predetermined amount of majority charge carriers (e.g., electrons) may be tunneled into and/or accumulated/stored in the charge trapping region 202(d) to represent that a logic high (e.g., binary "1" data state) is stored in the memory cell 12.

For an unselected memory cell 12, the voltage potential applied to the plurality of word lines (WL) 28 may be coupled to an electrical ground (e.g., 0V). A positive voltage potential may be applied to the drain region 724 via the bit line (CNn) 30. In a particular embodiment, the positive voltage potential applied to the drain region 724 via the unselected bit line (CNn) 30 may be 3.0V. The memory transistor (e.g., comprising the source region 720, the body region 722, and/or the drain region 724) may be turned to an "OFF" state. No majority charge carriers or a small amount of majority charge carriers (e.g., electrons) may be injected into the body region 722 of the memory cell 12. Thus, the program forward node tunnel write operation may not be performed on the unselected memory cell 12.

The program hot-electron write operation may perform a write logic high (e.g., binary "1" data state) operation by accumulating/storing majority charge carriers (e.g., electrons) in the memory cell 12. During the program hot-electron write operation, the P− substrate 130 may be coupled to an electrical ground (e.g., 0V) and the selected source region (Src<1>) 720 may be coupled to an electrical ground (e.g., 0V). The junction between the P− substrate 130 and the source region 720 may be reversed biased or weakly forward biased (e.g., above a reverse bias voltage and below a forward bias threshold voltage potential). A positive voltage potential may be applied to the drain region 724 via the bit line (CN1) 30. In a particular embodiment, the positive voltage potential applied to the drain region 724 via the bit line (CN1) 30 may be 5.0V.

A positive voltage potential may be applied to the first word line (WL<0>) 28 that may be capacitively coupled to the first floating body region 14a of the body region 722. A negative voltage potential may be applied to the second word line (WL<1>) 28 that may be capacitively coupled to the second floating body region 14b of the body region 722. The positive voltage potentials applied to the drain region 724 and/or the word line (WL<0>) 28 may create a band-to-band tunneling (gate-induced drain leakage "GIDL") effect between the drain region 724 and the body region 722. A predetermined amount of majority charge carrier (e.g., electrons) may be tunneled into the charge trapping region 202(d). The positive voltage potential applied to the first word line (WL<0>) 28 (e.g., that may be capacitively coupled to the first floating body region 14a of the body region 722) may cause an accumulation/storage of majority charge carriers (e.g., electrons) in the charge trapping region 202(d) of the first floating body region 14a. The negative voltage potential applied to the second word line (WL<1>) 28 may repel majority charge carriers (e.g., electrons) injected into the second floating body region 14b of the body region 722. The predetermined amount of majority charge carriers (e.g., electrons) stored in the first floating body region 14a of the body region 722 may represent that a logic high (e.g., binary "1" data state) is stored in the memory cell 12.

A read operation may be performed to read a data state (e.g., a logic low (e.g., binary "0" data state) and/or a logic high (e.g., binary "1" data state)) stored in the memory cell 12. During a read operation, the P− substrate 130 may be coupled to an electrical ground (e.g., 0V) and the selected source region (Src<1>) 720 may be coupled to an electrical ground (e.g., 0V). A positive voltage potential may be applied to the drain region 724 of the memory cell 12 via the bit line (CN) 30. In a particular embodiment, the positive voltage potential applied to the drain region 724 may be 1.0V. A positive voltage potential may be applied to the first word line (WL0<0>) 28 that may be capacitively coupled to the first floating body region 14a of the body region 722 via the tunneling insulating layer 202. A negative voltage potential may be applied to the second word line (WL<1>) 28 that may be capacitively coupled to the second floating body region 14b of the body region 722 via the tunneling insulating layer 202. In a particular embodiment, the positive voltage potential applied to the first word line (WL<0>) 28 that may be capacitively coupled to the first floating body region 14a may be 3.0V. In another embodiment, the negative voltage potential applied to the second word line (WL<1>) 28 that may be capacitively coupled to the second floating body region 14b may be −3.0V.

Under such biasing, the memory transistor (e.g., comprising the source region 720, the body region 722, and/or the drain region 724 may be turned to an "ON" state via the first floating body region 14a and/or the drain region 724. The memory transistor (e.g., comprising the source region 720, the body region 722, and/or the drain region 724) may be turned to an "OFF" state via the second floating body region 14b and the drain region 724. The majority charge carriers (e.g., electrons) may flow from the first floating body region 14a to the drain region 724 when the memory transistor (e.g., comprising the source region 720, the body region 722, and/or the drain region 724) is turned to an "ON" state. In a particular embodiment, when a logic low (e.g., binary "0" data state) is stored in the memory cell 12, a predetermined amount of voltage potential and/or current may be detected at the drain region 724. In another embodiment, when a logic high (e.g., binary "1" data state) is stored in the memory cell 12, no voltage potential and/or current may be detected at the drain region 724.

At this point it should be noted that providing a semiconductor memory device in accordance with the present disclosure as described above may involve the processing of input data and the generation of output data to some extent. This input data processing and output data generation may be implemented in hardware or software. For example, specific electronic components may be employed in a semiconductor memory device or similar or related circuitry for implementing the functions associated with providing a semiconductor memory device in accordance with the present disclosure as described above. Alternatively, one or more processors operating in accordance with instructions may implement the functions associated with providing a semiconductor memory device in accordance with the present disclosure as described above. If such is the case, is within the scope of the present disclosure that such instructions may be stored on one or more non-transitory processor readable storage media (e.g., a magnetic disk or other storage medium), or transmitted to one or more processors via one or more signals embodied in one or more carrier waves.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of at least one particular implementation in at least one particular environment for at least one particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:
1. A semiconductor memory device comprising:
 a plurality of memory cells arranged in an array of rows and columns, each memory cell comprising:
  a first region coupled to a source line;
  a second region coupled to a bit line; and a body region capacitively coupled to two distinct word lines via two respective multilayer tunneling insulating regions and disposed between the first region and the second region, wherein each of the two distinct word lines is disposed directly adjacent to its respective multilayer tunneling insulating region, wherein each of the two distinct word lines is configured to be operated independently to control access to a respective portion of the body region, and wherein the two respective multilayer tunneling insulating regions extend along respective lateral sides of the first region, the second region, and the body region beyond where the body region is capacitively coupled to the two distinct word lines;

wherein the first region, the body region, and the second region are disposed in a respective sequential contiguous relationship and extend outward from a substrate in a pillar structure.

2. The semiconductor memory device according to claim 1, wherein the first region and the second region are doped with donor impurities.

3. The semiconductor memory device according to claim 1, wherein the body region is doped with acceptor impurities.

4. The semiconductor memory device according to claim 1, wherein each tunneling insulating layer comprises a plurality of insulating or dielectric layers.

5. The semiconductor memory device according to claim 4, wherein the plurality of insulating or dielectric layers comprise at least one of a thermal oxide layer, a nitride layer, an oxide layer, a charge trapping nitride layer, and a blocking oxide layer.

6. The semiconductor memory device according to claim 5, wherein the plurality of insulating or dielectric layers are of various thicknesses.

7. The semiconductor memory device according to claim 1, wherein at least one word line comprises a plurality of layers.

8. The semiconductor memory device according to claim 7 wherein the plurality of layers of the word line comprise a first silicon layer having a thickness of approximately one tenth of a thickness of a second metal layer.

9. The semiconductor memory device according to claim 1, wherein the substrate defines a plane and is coupled to an electrical ground.

10. The semiconductor memory device according to claim 1, wherein the body region comprises a first floating body region and a second floating body region.

11. The semiconductor memory device according to claim 10, wherein the first floating body region is capacitively coupled to a first word line of the two distinct word lines and the second floating body region is capacitively coupled to a second word line of the two distinct word lines.

12. The semiconductor memory device according to claim 1, wherein at least one word line is capacitively coupled to a second body region.

13. The semiconductor memory device according to claim 12, wherein the at least one word line is capacitively coupled to a first floating gate region of the body region and a second floating gate region of the second body region.

14. The semiconductor memory device according to claim 1 wherein the first region comprises a continuous planar region.

15. The semiconductor memory device according to claim 14, wherein the first region further comprises a plurality of protrusions formed on the continuous planar region.

16. The semiconductor memory device according to claim 1, wherein the first region comprises an elongated continuous planar region.

17. The semiconductor memory device according to claim 16, wherein the elongated continuous planar region forms a column or a row of the array.

18. A method for biasing a semiconductor memory device comprising the steps of:
applying a plurality of voltage potentials to a plurality of memory cells arranged in an array of rows and columns, wherein applying the plurality of voltage potentials to the plurality of memory cells comprises for each memory cell:
applying a first voltage potential to a first region of the memory cell;
applying a second voltage potential to a second region of the memory cell; and
applying respective third voltage potentials to a body region of the memory cell via two distinct word lines that are capacitively coupled to the body region via two respective multilayer tunneling insulating regions, wherein each of the two distinct word lines is disposed directly adjacent to its respective multilayer tunneling insulating region, wherein each of the two distinct word lines is configured to be operated independently to control access to a respective portion of the body region, and wherein the two respective multilayer tunneling insulating regions extend along respective lateral sides of the first region, the second region, and the body region beyond where the body region is capacitively coupled to the two distinct word lines;
wherein the first region, the body region, and the second region are disposed in a respective sequential contiguous relationship and extend outward from a substrate in a pillar structure.

19. The method according to claim 18, further comprising coupling the substrate to an electrical ground.

20. The method according to claim 19, wherein the first voltage potential is applied to the first region to perform a write logic low operation.

21. The method according to claim 20, wherein at least one third voltage potential applied to the body region is a negative voltage potential to repel majority charge carriers from the body region in order to perform the write logic low operation.

22. The method according to claim 19, wherein the second voltage potential applied to the second region and at least one of the third voltage potentials applied to the body region are to perform a write logic low operation.

23. The method according to claim 22, wherein the at least one of the third voltage potentials applied to the body region is a negative voltage potential that tunnels minority charge carriers into the body region in order to perform the write logic low operation.

24. The method according to claim 19, wherein the second voltage potential applied to the second region and at least one of the third voltage potentials applied to the body region are positive voltage potentials in order to perform a write logic high operation.

25. The method according to claim 24, wherein the positive voltage potentials applied to the second region and the body region creates a band-to-band tunneling effect to tunnel majority charge carriers to the body region in order to perform the write logic high operation.

26. The method according to claim 19, wherein the second voltage potential applied to the second region and at least one of the third voltage potentials applied to the body region are to perform a write logic high operation.

27. The method according to claim 26, wherein majority charge carriers are injected into the body region to perform the write logic high operation.

28. The method according to claim 19, wherein the second voltage potential applied to the second region and at least one of the third voltage potentials applied to the body region are positive voltage potentials in order to perform a read operation.

* * * * *